(12) United States Patent
Endo

(10) Patent No.: US 8,319,577 B2
(45) Date of Patent: Nov. 27, 2012

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 272 days.

(21) Appl. No.: 12/588,712

(22) Filed: Oct. 26, 2009

(65) Prior Publication Data
US 2010/0109793 A1    May 6, 2010

(30) Foreign Application Priority Data

Oct. 31, 2008  (JP) ................................. 2008-281409
Oct. 31, 2008  (JP) ................................. 2008-281772

(51) Int. Cl.
*H03H 7/42* (2006.01)
*H01P 3/08* (2006.01)

(52) U.S. Cl. ........................................ 333/25; 333/238
(58) Field of Classification Search ............. 333/25, 333/26, 238
See application file for complete search history.

(56) References Cited

U.S. PATENT DOCUMENTS

| 6,628,189 B2 | 9/2003 | Yazaki et al. |
| 6,954,116 B2 | 10/2005 | Nosaka |
| 7,250,828 B2 * | 7/2007 | Erb .................................. 333/26 |
| 7,663,448 B2 * | 2/2010 | Harada et al. .................... 333/26 |
| 2008/0258837 A1 | 10/2008 | Liu et al. |
| 2010/0109792 A1 * | 5/2010 | Endo ................................ 333/26 |

FOREIGN PATENT DOCUMENTS

| JP | A-2002-50910 | 2/2002 |
| JP | A-2004-274715 | 9/2004 |
| JP | B2-3800121 | 7/2006 |

* cited by examiner

*Primary Examiner* — Dean O Takaoka
(74) *Attorney, Agent, or Firm* — Oliff & Berridge, PLC

(57) ABSTRACT

To provide a thin film balun that can improve balance characteristics while maintaining miniaturization. In a thin film balun to which an embodiment relates, an auxiliary coil portion is disposed at a predetermined position so as to face any one of an unbalanced transmission line and a balanced transmission line.

6 Claims, 25 Drawing Sheets

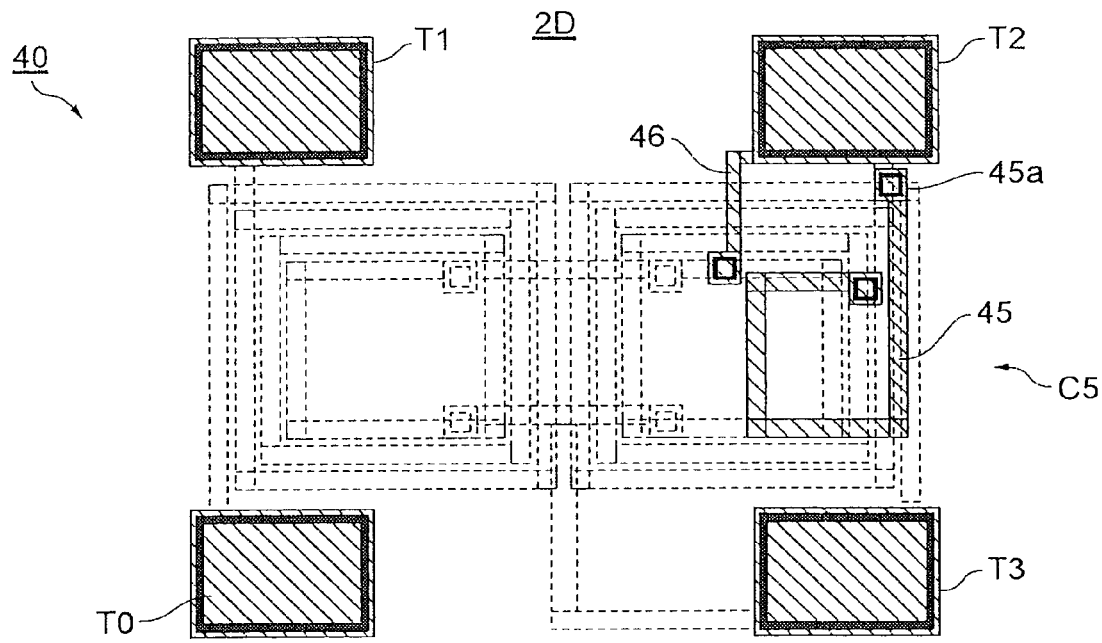
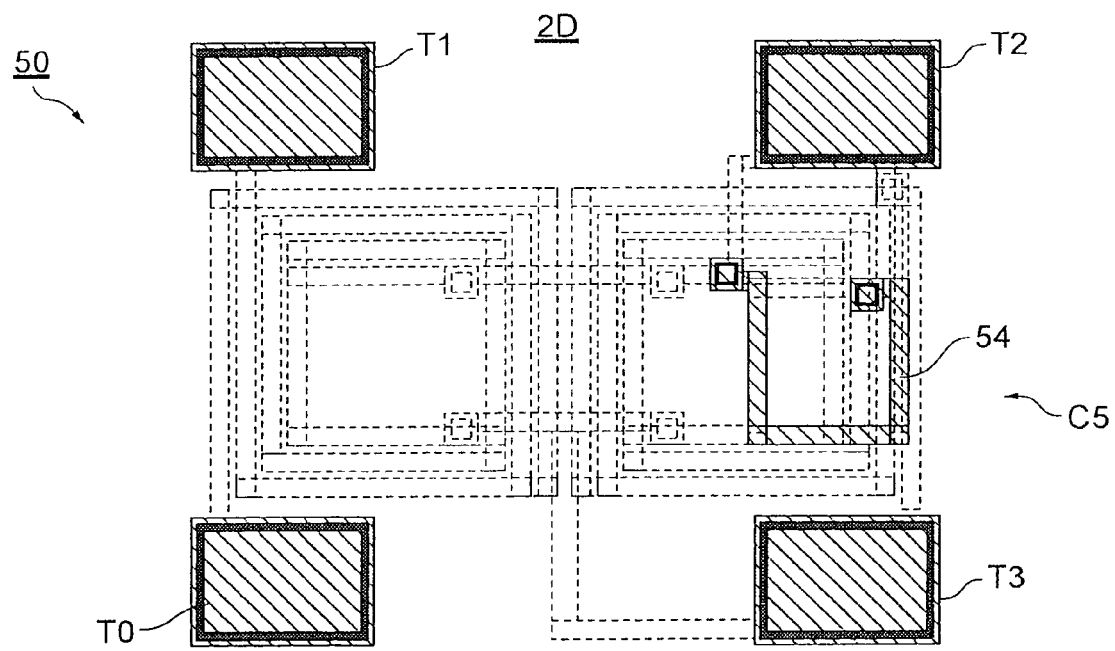

THIN FILM BALUN

BACKGROUND OF THE INVENTION

1. Field of the Invention

The present invention relates to a balun that performs conversion between unbalanced and balanced signals, and in particular relates to a thin film balun that is formed by a thin film process advantageous for smaller and thinner models.

2. Description of the Related Art

A wireless communication device includes various high frequency elements such as an antenna, a filter, an RF switch, a power amplifier, an RF-IC, and a balun. Of these elements, a resonant element such as an antenna or a filter handles an unbalanced signal which is based on a ground potential, whereas an RF-IC which generates or processes a high frequency signal handles a balanced signal. Accordingly, when connecting these two elements, a balun that functions as an unbalanced-balanced converter is used.

In design of the above-mentioned balun, lengths and shapes of coils (line portions) are optimized so that desired balance characteristics can be achieved in signal frequencies which are subject to conversion, while maintaining the miniaturization of the balun in order to meet recent demands for smaller electronic devices (for example, see Japanese Patent No. 3800121).

SUMMARY OF THE INVENTION

However, when a length of a coil is increased on a same plane to improve balance characteristics, a surface area of the coil increases, which makes it impossible to maintain the miniaturization of the balun. Hence there is a need to improve balance characteristics without increasing the length of the coil on the same plane.

The present invention was conceived in view of the above-mentioned circumstances, and has an object of providing a thin film balun that can improve balance characteristics while maintaining miniaturization.

To solve the stated problem, a thin film balun according to the present invention includes: an unbalanced transmission line including a first coil portion and a second coil portion; a balanced transmission line including a third coil portion and a fourth coil portion that are magnetically coupled to the first coil portion and the second coil portion, respectively; an unbalanced terminal connected to the first coil portion; a first balanced terminal connected to the third coil portion; a second balanced terminal connected to the fourth coil portion; and an auxiliary coil portion connected at least one of: between the third coil portion and the first balanced terminal; and between the fourth coil portion and the second balanced terminal, wherein the auxiliary coil portion is positioned so as not to overlap coil openings of the first to fourth coil portions.

According to this structure, the balance characteristics of the thin film balun are adjusted by changing an inductance or a formation position of the auxiliary coil portion connected between the third coil portion and the first balanced terminal and/or between the fourth coil portion and the second balanced terminal. In particular, it has been verified by the inventors of the present application that, for improving the balance characteristics of the thin film balun, the auxiliary coil portion needs to be positioned so as not to overlap coil openings of the first to fourth coil portions.

For example, the auxiliary coil portion is preferably connected between the fourth coil portion and the second balanced terminal. Moreover, the auxiliary coil portion is preferably positioned in at least one of an area facing coil conductors of the first and third coil portions and an area facing coil conductors of the second and fourth coil portions. As an example, the auxiliary coil portion is positioned in the area facing the coil conductors of the second and fourth coil portions. It has been verified by the inventors of the present application that these structures have effects of improving the balance characteristics of the thin film balun, though detailed actions are not clear.

Moreover, a thin film balun according to the present invention includes: an unbalanced transmission line including a first coil portion and a second coil portion; a balanced transmission line including a third coil portion and a fourth coil portion that are magnetically coupled to the first coil portion and the second coil portion, respectively; an unbalanced terminal connected to the first coil portion; a first balanced terminal connected to the third coil portion; a second balanced terminal connected to the fourth coil portion; and an auxiliary coil portion connected at least one of: between the third coil portion and the first balanced terminal; and between the fourth coil portion and the second balanced terminal, wherein a winding direction of the auxiliary coil portion is different from a winding direction of at least the second coil portion included in the unbalanced transmission line.

According to this structure, the balance characteristics of the thin film balun are adjusted by changing an inductance of the auxiliary coil portion connected between the third coil portion and the first balanced terminal and/or between the fourth coil portion and the second balanced terminal. In particular, it has been verified by the inventors of the present application that, for improving the balance characteristics of the thin film balun, the auxiliary coil portion needs to be formed so as to have a different winding direction from a winding direction of at least the second coil portion included in the unbalanced transmission line. A preferred example of the different winding direction is an opposite direction.

For example, the auxiliary coil portion is preferably connected between the fourth coil portion and the second balanced terminal. Moreover, regarding the position of the auxiliary coil portion, at least one part of the auxiliary coil portion is preferably positioned in an area facing a coil opening of at least one of the first coil portion and the second coil portion. Alternatively, the auxiliary coil portion is preferably positioned in at least one of an area facing coil conductors of the first and third coil portions and an area facing coil conductors of the second and fourth coil portions. Here, the auxiliary coil portion is preferably positioned in the area facing the coil conductors of the second and fourth coil portions. It has been verified by the inventors of the present application that these structures have effects of improving a phase balance and an output balance of the thin film balun, though detailed actions are not clear.

BRIEF DESCRIPTION OF THE DRAWINGS

FIG. 31 is a plan view showing the fourth wiring layer 40 of a thin film balun 2D in a comparative example 2D.

FIG. 32 is a plan view showing the fifth wiring layer 50 of the thin film balun 2D in the comparative example 2D.

DESCRIPTION OF THE PREFERRED EMBODIMENTS

Figure 1:
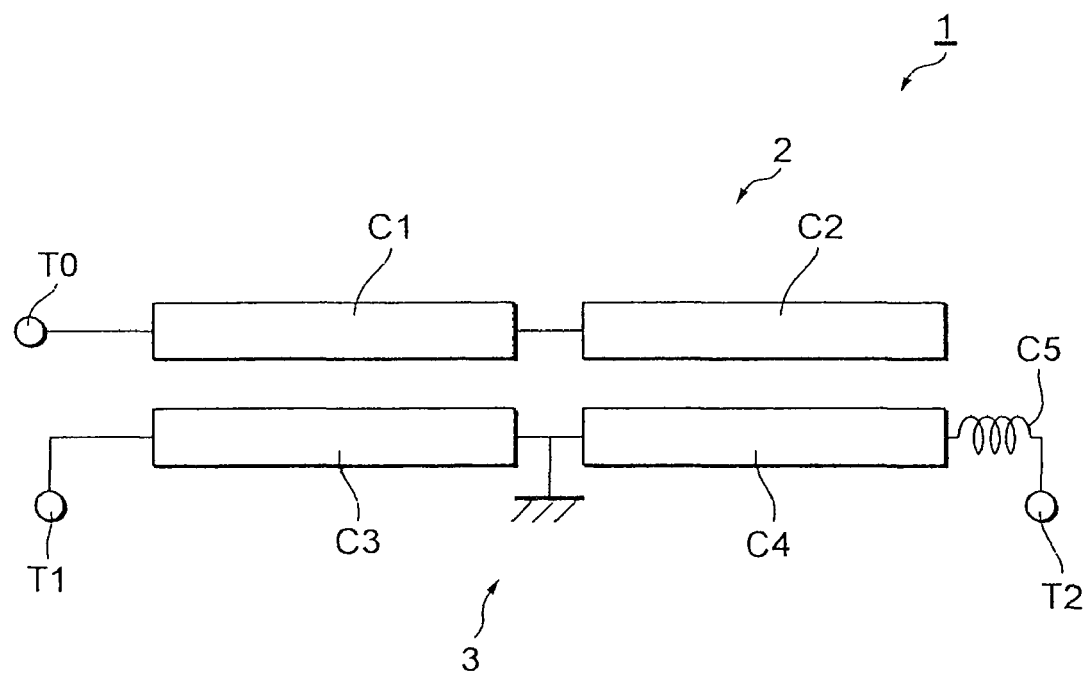
FIG. 1 is an equivalent circuit diagram of a thin film balun 1 according to an embodiment of the present invention.

The following describes an embodiment of the present invention with reference to drawings. Note that the same components in the drawings are given the same reference signs, and repeated description is omitted. Moreover, the positional relationships such as up, down, left, and right are based on the positional relationships shown in the drawings, unless otherwise specified. Furthermore, scale ratios of the drawings are not limited to the illustrated ratios. Note also that the following embodiment is merely an example for describing the present invention, and the present invention is not limited to the embodiment. Various changes can be made without departing from the scope of the present invention.

FIG. 1 is an equivalent circuit diagram of a thin film balun 1 according to this embodiment.

As shown in FIG. 1, the thin film balun 1 has an unbalanced transmission line 2 including a first coil portion C1 and a second coil portion C2, and a balanced transmission line 3 including a third coil portion C3 and a fourth coil portion C4 that are magnetically coupled to the first coil portion C1 and the second coil portion C2, respectively. The thin film balun 1 also has an unbalanced terminal T0 connected to the first coil portion C1, a first balanced terminal T1 connected to the third coil portion C3, and a second balanced terminal T2 connected to the fourth coil portion C4. Furthermore, an auxiliary coil portion C5 is provided between the fourth coil portion C4 and the second balanced terminal T2.

The connection relationships are described in more detail below. The first coil portion C1 and the second coil portion C2 are connected in series with the unbalanced terminal T0, where an opposite side of the second coil portion C2 to the first coil portion C1 is terminated. Meanwhile, the third coil portion C3, the fourth coil portion C4, and the auxiliary coil portion C5 are connected in series between the first balanced terminal T1 and the second balanced terminal T2. A connecting point between the third coil portion C3 and the fourth coil portion C4 is fixed at a ground potential.

Lengths of the above-mentioned coil portions C1 to C4 change depending on specifications of the thin film balun, but are set so as to form a quarter-wavelength resonator circuit of a signal which is subject to conversion. Shapes of the coil portions C1 to C4 are arbitrary, and may be any of a spiral, a zigzag, and a straight line.

A basic operation of the thin film balun 1 is described below, with reference to FIG. 1.

In the thin film balun 1 described above, when an unbalanced signal is input in the unbalanced terminal T0, the unbalanced signal propagates through the first coil portion C1 and the second coil portion C2. Due to the magnetic coupling of the first coil portion C1 with the third coil portion C3 and the magnetic coupling of the second coil portion C2 with the fourth coil portion C4, the unbalanced signal is converted to two balanced signals whose phases are different by 180°, and the two balanced signals are output from the first balanced terminal T1 and the second balanced terminal T2. A converting operation from balanced signals to an unbalanced signal is the reverse of the above-mentioned operation.

It is clear from the above-mentioned balun operation that the balance characteristics of the balun constitute an important factor. The balance characteristics can be regarded as more excellent when the phase difference between the two balanced signals is closer to 180° and the outputs (amplitudes) of the two balanced signals are closer to each other.

The inventors of the present application found that the balance characteristics can be improved by limiting a formation position of the auxiliary coil portion C5 in the thin film balun 1 described above. The following describes specific placement of the auxiliary coil portion C5, with reference to each example.

Example 1A

Figure 2:
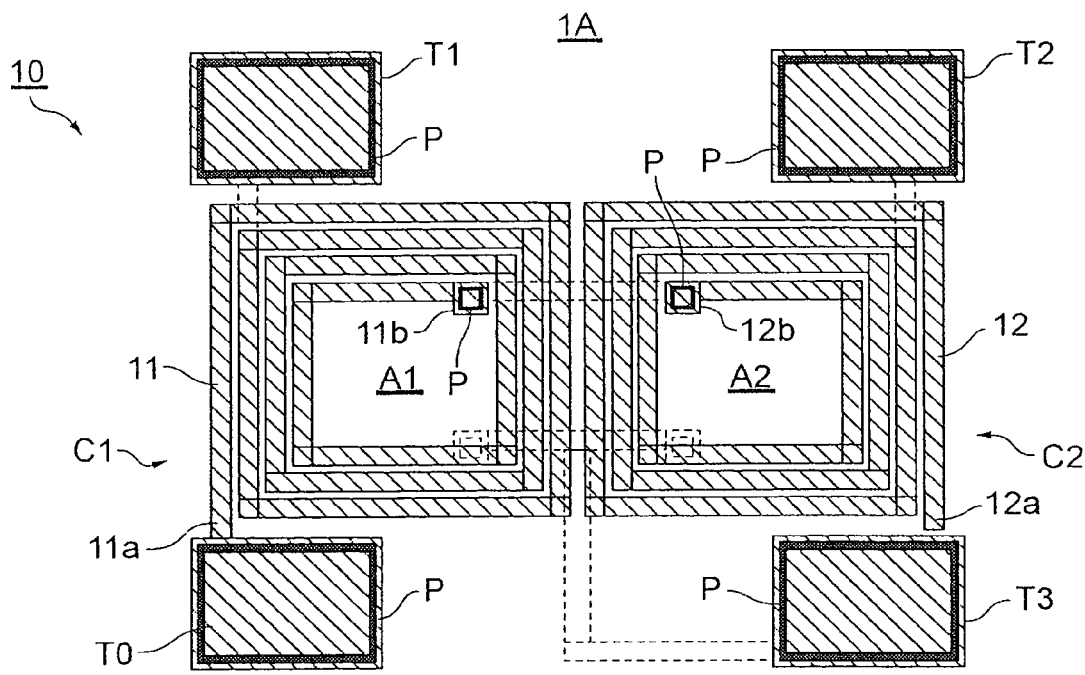
FIG. 2 is a plan view showing a first wiring layer 10 of a thin film balun 1A in an example 1A.
Figure 3:
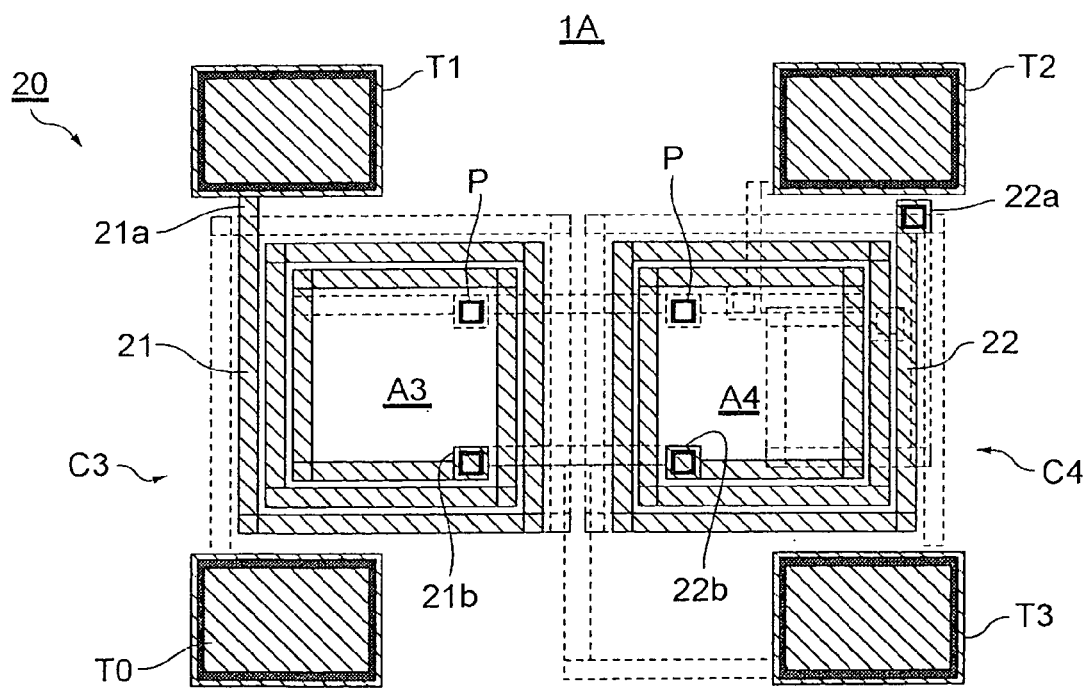
FIG. 3 is a plan view showing a second wiring layer 20 of the thin film balun 1A in the example 1A.
Figure 4:
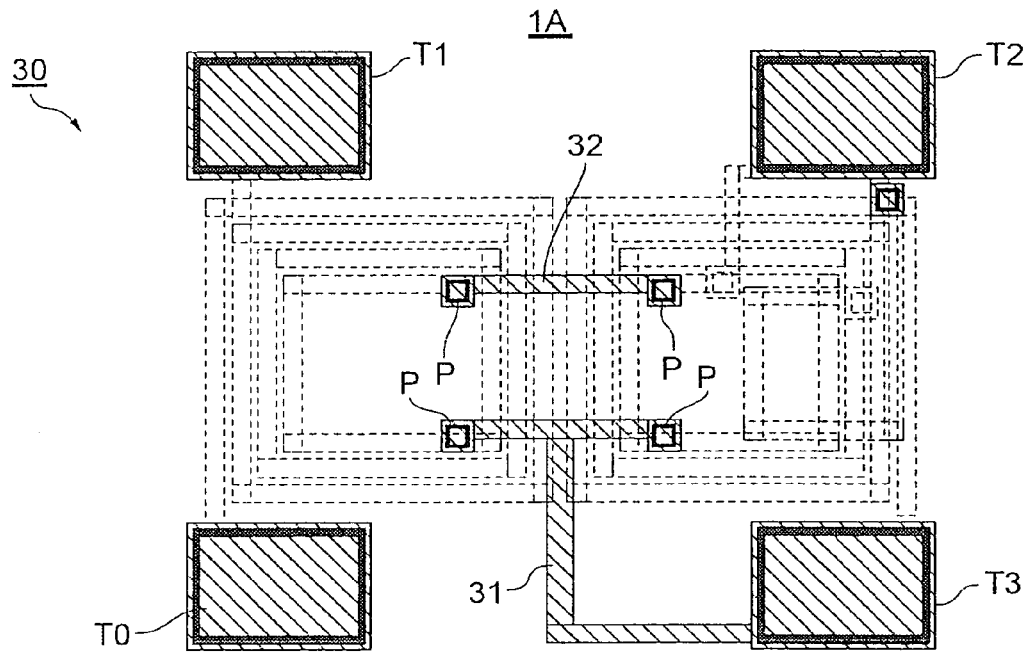
FIG. 4 is a plan view showing a third wiring layer 30 of the thin film balun 1A in the example 1A.
Figure 5:
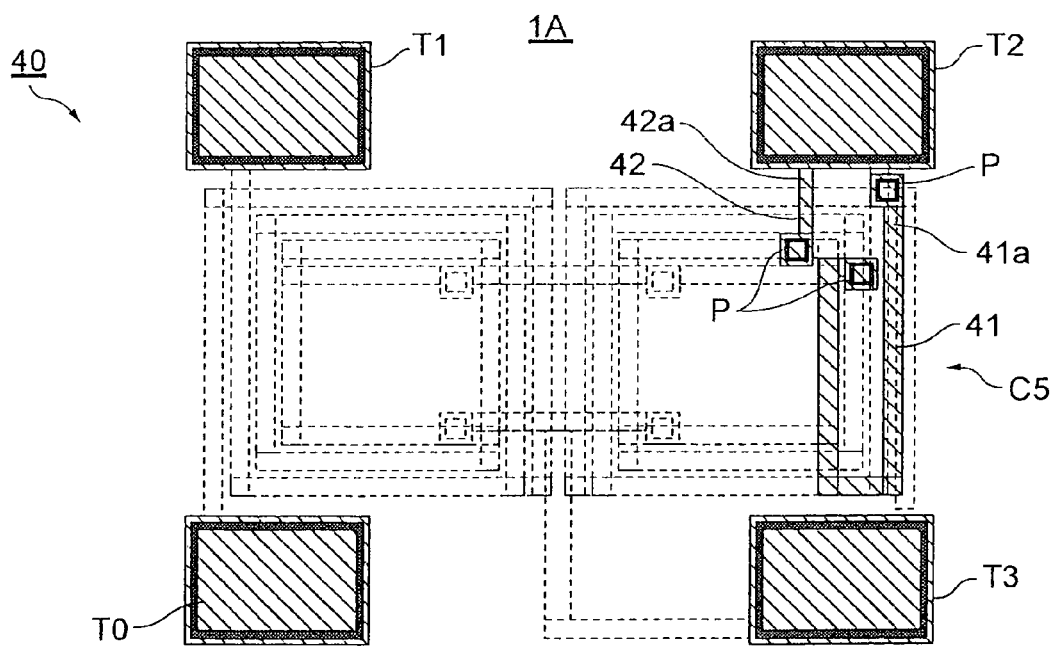
FIG. 5 is a plan view showing a fourth wiring layer 40 of the thin film balun 1A in the example 1A.
Figure 6:
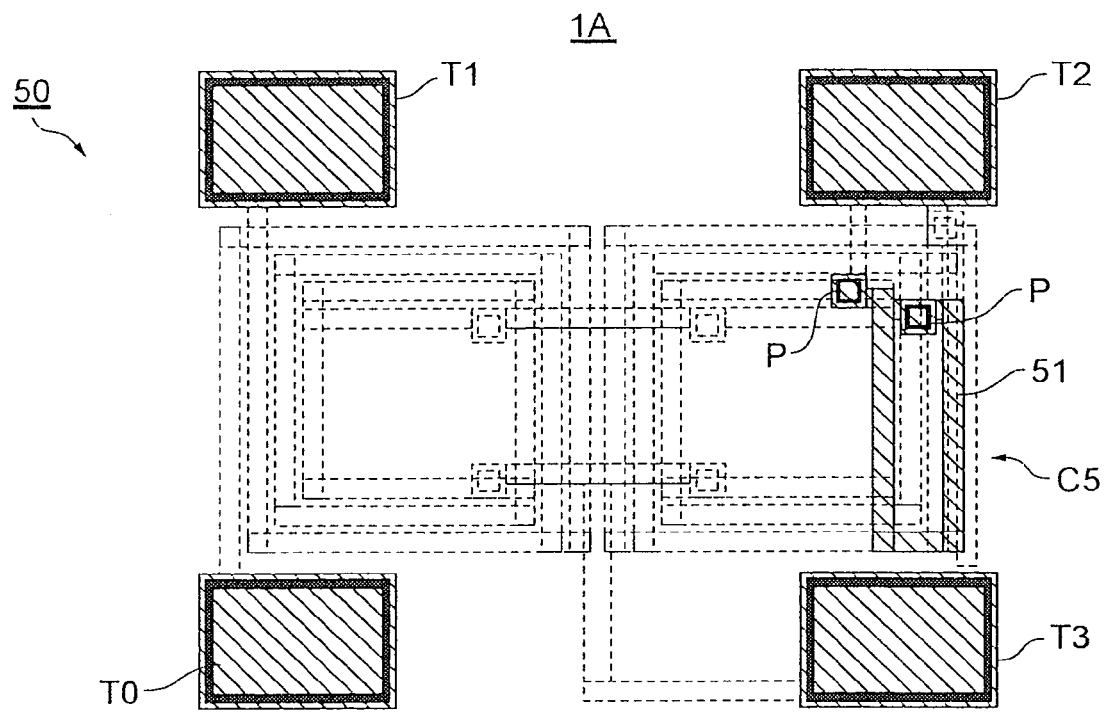
FIG. 6 is a plan view showing a fifth wiring layer 50 of the thin film balun 1A in the example 1A.

FIGS. 2 to 6 are plan views of individual wiring layers of a thin film balun 1A in an example 1A. In detail, FIG. 2 is a plan view of a first wiring layer 10, FIG. 3 is a plan view of a second wiring layer 20, FIG. 4 is a plan view of a third wiring layer 30, FIG. 5 is a plan view of a fourth wiring layer 40, and FIG. 6 is a plan view of a fifth wiring layer 50. The first wiring layer 10 is a lowermost wiring layer, and the fifth wiring layer 50 is an uppermost wiring layer. A substrate is located under the first wiring layer 10 which is the lowermost layer, though not shown in the drawings. That is, the thin film balun is formed on the substrate.

As shown in FIGS. 2 to 6, the unbalanced terminal T0, the first balanced terminal T1, the second balanced terminal T2, and a ground terminal T3 are formed on all layers of the first wiring layer 10 to the fifth wiring layer 50. Each of the terminals T0 to T3 is electrically connected between different layers via a through hole P. Note that all through holes P shown in FIGS. 2 to 6 are electroplated for electrical conduction of upper and lower layers. A structure of each wiring layer is described in detail below.

As shown in FIG. 2, the first coil portion C1 and the second coil portion C2 which constitute the unbalanced transmission line 2 are formed adjacent to each other on the first wiring layer 10. Each of the coil portions C1 and C2 forms an equivalent of a quarter-wavelength resonator. An outer end 11a of a coil conductor 11 constituting the first coil portion C1 is connected to the unbalanced terminal T0, and an inner end 11b of the coil conductor 11 is connected to a through hole P. An inner end 12b of a coil conductor 12 constituting the second coil portion C2 is connected to a through hole P, and an outer end 12a of the coil conductor 12 is open. A coil opening A1 is defined by the coil conductor 11 of the first coil portion C1, and a coil opening A2 is defined by the coil conductor 12 of the second coil portion C2.

As shown in FIG. 3, the third coil portion C3 and the fourth coil portion C4 which constitute the balanced transmission line 3 are formed adjacent to each other on the second wiring layer 20. Each of the coil portions C3 and C4 forms an equivalent of a quarter-wavelength resonator. The coil portions C3 and C4 of the balanced transmission line 3 are positioned facing the coil portions C1 and C2 of the unbalanced transmission line 2 respectively, and the facing portions are magnetically coupled to form couplers. An outer end 21a of a coil conductor 21 constituting the third coil portion C3 is connected to the first balanced terminal T1, and an inner end 21b of the coil conductor 21 is connected to a through hole P. An outer end 22a and an inner end 22b of a coil conductor 22 constituting the fourth coil portion C4 are each connected to a through hole P. A coil opening A3 is defined by the coil conductor 21 of the third coil portion C3, and a coil opening A4 is defined by the coil conductor 22 of the fourth coil portion C4.

As shown in FIG. 4, a wire 31 for electrically connecting the third coil portion C3 and the fourth coil portion C4 to the ground terminal T3 and a wire 32 for electrically connecting the first coil portion C1 and the second coil portion C2 are formed on the third wiring layer 30. The wire 31 has a shape that branches so as to connect two through holes P to the ground terminal T3. The wire 31 is connected to the end 21b of the coil conductor 21 and the end 22b of the coil conductor 22, via the two through holes P. The wire 32 is connected to the end 11b of the coil conductor 11 and the end 12b of the coil conductor 12, via through holes P.

As shown in FIG. 5, coil conductors 41 and 42 that constitute a part of the auxiliary coil portion C5 are formed on the fourth wiring layer 40. One end 42a of the coil conductor 42 is connected to the second balanced terminal T2, and one end 41a of the coil conductor 41 is connected to the end 22a of the coil conductor 22 constituting the fourth coil portion C4 via a through hole P.

As shown in FIG. 6, a coil conductor 51 that constitutes a part of the auxiliary coil portion C5 is formed on the fifth wiring layer 50. Ends of the coil conductor 51 are each connected to a different one of the other ends of the coil conductors 41 and 42.

As shown in FIGS. 5 and 6, the auxiliary coil portion C5 is formed by connecting the coil conductor 42, the coil conductor 51, and the coil conductor 41 via through holes P. The end 42a of the coil conductor 42, which is one end of the auxiliary coil portion C5, is connected to the second balanced terminal T2, and the end 41a of the coil conductor 41, which is the other end of the auxiliary coil portion C5, is connected to the coil conductor 22 of the fourth coil portion C4.

As described above, in the thin film balun 1A of the example 1A, the auxiliary coil portion C5 is electrically connected between the fourth coil portion C4 and the second balanced terminal T2. Moreover, a planar layout of the auxiliary coil portion C5 is set so as not to overlap the coil opening A1 of the first coil portion C1 and the coil opening A2 of the second coil portion C2. The overlap referred to here is an overlap that can be recognized when observing in a lamination direction of the wiring layers 10 to 50. In more detail, in the example 1A, the auxiliary coil portion C5 is positioned in an area facing the coil conductors of the second coil portion C2 and the fourth coil portion C4. In the specification of the present application, a coil portion denotes a portion that includes both a coil conductor and a coil opening defined by the coil conductor.

The above describes the example where, to the thin film balun structure in which the two coils C1 and C2 constituting the unbalanced transmission line are formed on the same first layer, the two coils C3 and C4 constituting the balanced transmission line are formed on the second layer that is another layer adjacent to the first layer, and the wire connecting the coils C1 and C2 and the wire connecting the coils C3 and C4 are formed on the third layer that is adjacent to the second layer on an opposite side to the first layer, the auxiliary coil C5 is additionally formed using the two layers, namely, the fourth layer that is adjacent to the third layer on an opposite side to the second layer and the fifth layer that is adjacent to the fourth layer on an opposite side to the third layer. However, the auxiliary coil may instead be formed using the third layer and the fourth layer. This changes a magnetic coupling state, as a result of which further improvements in characteristics can be expected.

Needless to say, the auxiliary coil is not limited to two layers, and may be formed only on one layer such as the fourth layer or the third layer. Design can be made according to desired characteristics.

Various examples and comparative examples were prepared to evaluate how the formation position of the auxiliary coil portion C5 affects the balance characteristics of the thin film balun. The following first describes layouts of the various examples and comparative examples, and then describes evaluation results of their balance characteristics.

Example 1B

Figure 7:
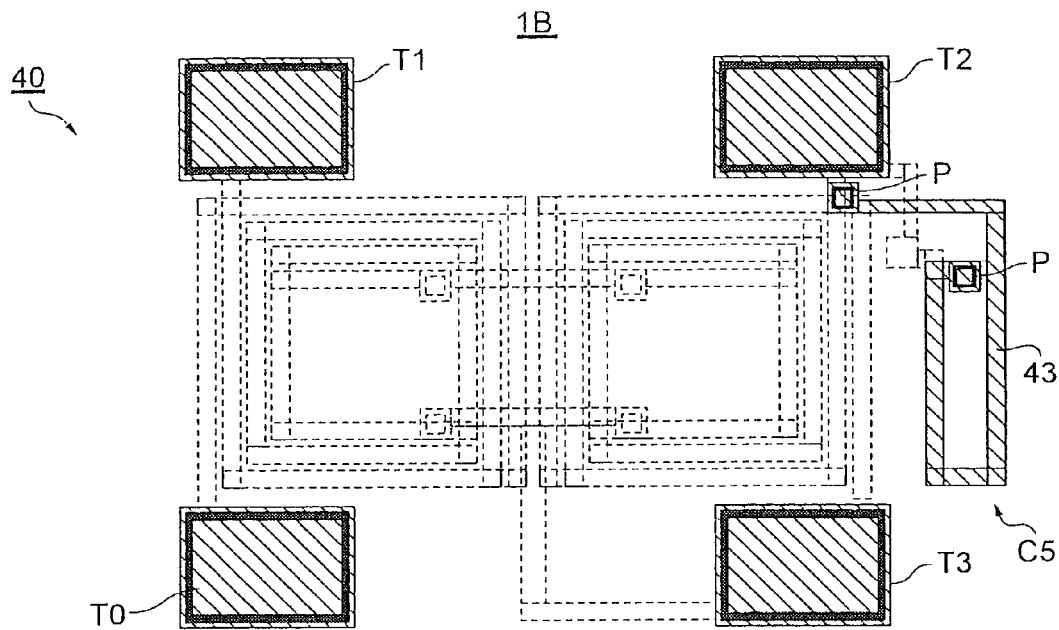
FIG. 7 is a plan view showing the fourth wiring layer 40 of a thin film balun 1B in an example 1B.
Figure 8:
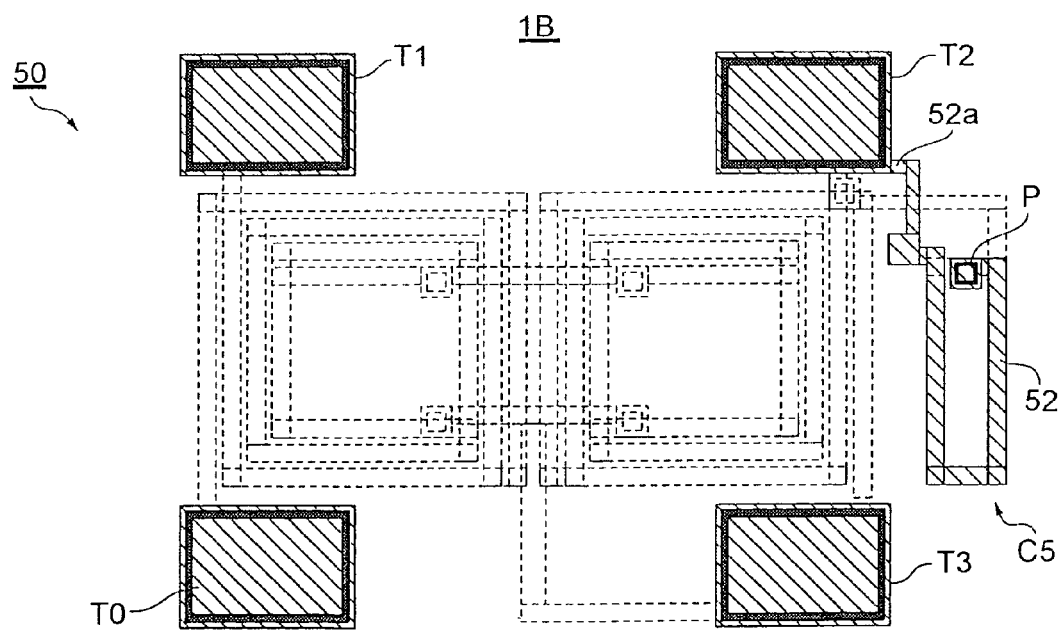
FIG. 8 is a plan view showing the fifth wiring layer 50 of the thin film balun 1B in the example 1B.

In an example 1B, the auxiliary coil portion C5 is positioned so as not to overlap the coil openings and the coil conductors of the first coil portion C1 and the second coil portion C2. FIGS. 7 and 8 are plan views respectively showing the fourth wiring layer 40 and the fifth wiring layer 50 of a thin film balun 1B in the example 1B. Note that the first wiring layer 10 to the third wiring layer 30 of the thin film balun 1B in the example 1B have the same structures as the example 1A.

As shown in FIGS. 7 and 8, the auxiliary coil portion C5 is constituted by a coil conductor 43 of the fourth wiring layer 40 and a coil conductor 52 of the fifth wiring layer 50. One end of the coil conductor 43 is connected to one end of the coil conductor 52 via a through hole P, and the other end of the coil conductor 43 is connected to the end 22a of the coil conductor 22 constituting the fourth coil portion C4 via a through hole P. The other end 52a of the coil conductor 52 is connected to the second balanced terminal T2.

In the example 1B, the auxiliary coil portion C5 is positioned outside so as not to overlap the coil openings and the coil conductors of the first coil portion C1 and the second coil portion C2, as shown in FIGS. 7 and 8.

Comparative Example 1C

Figure 9:
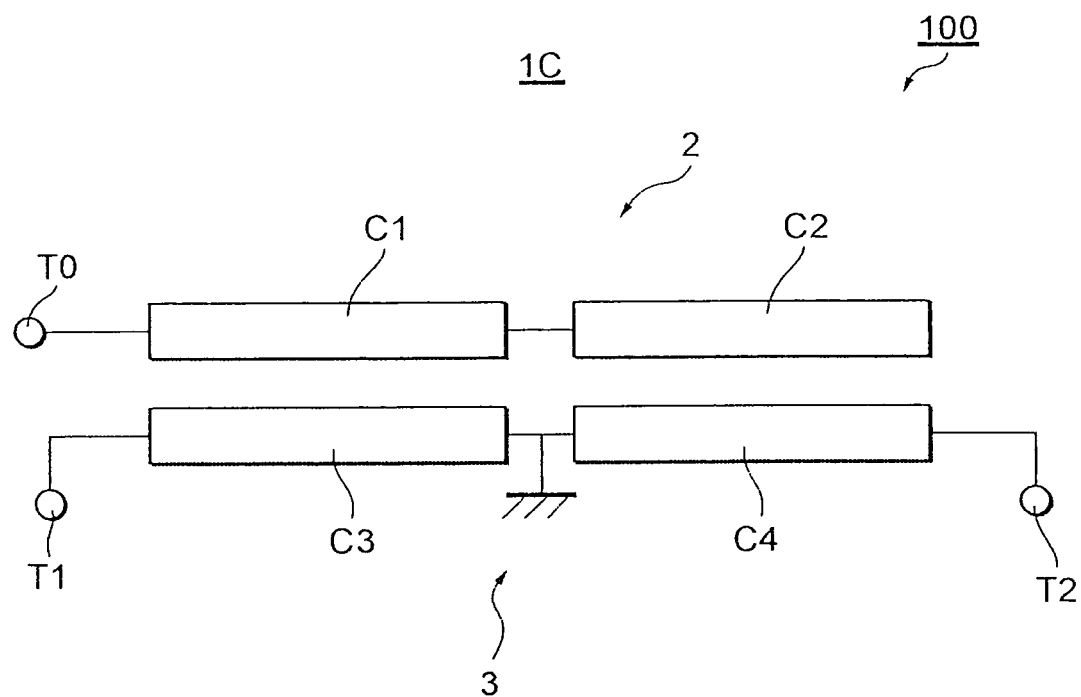
FIG. 9 is an equivalent circuit diagram of a thin film balun 1C in a comparative example 1C.

FIG. 9 is an equivalent circuit diagram of a thin film balun 1C in a comparative example 1C. The thin film balun 1C of the comparative example 1C does not have the auxiliary coil portion C5 between the fourth coil portion C4 and the second balanced terminal T2. In detail, the thin film balun 1C of the comparative example 1C has a structure in which the end 22a of the coil conductor 22 of the second wiring layer 20 shown in FIG. 3 is connected to the second balanced terminal T2, and the coil conductors 41, 42, and 51 of the fourth wiring layer 40 and the fifth wiring layer 50 shown in FIGS. 5 and 6 are omitted.

Comparative Example 1D

Figure 10:
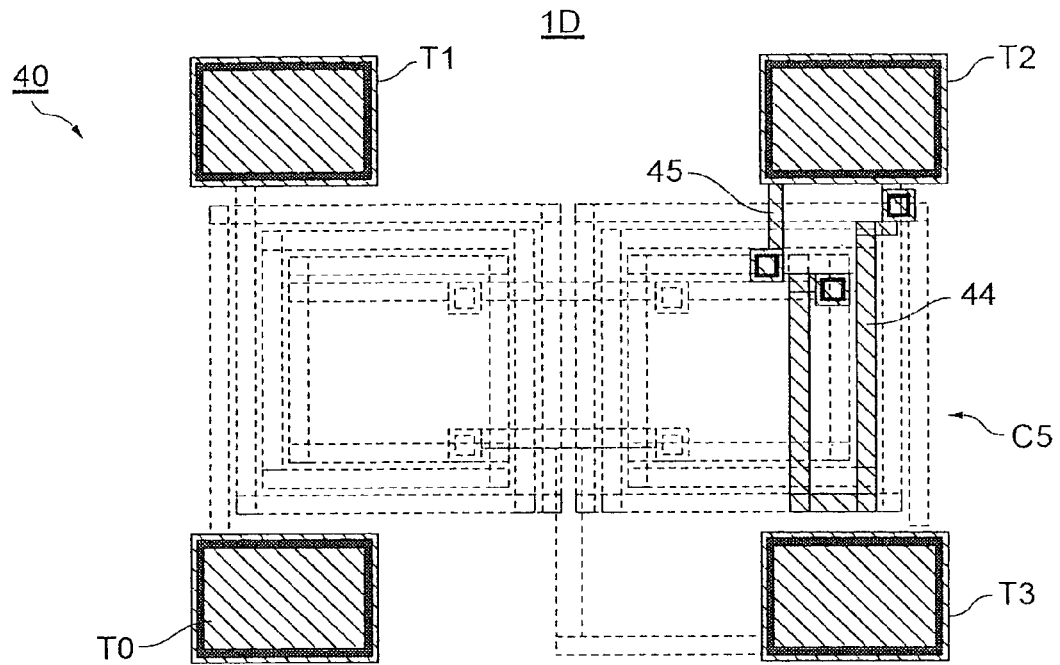
FIG. 10 is a plan view showing the fourth wiring layer 40 of a thin film balun 1D in a comparative example 1D.
Figure 11:
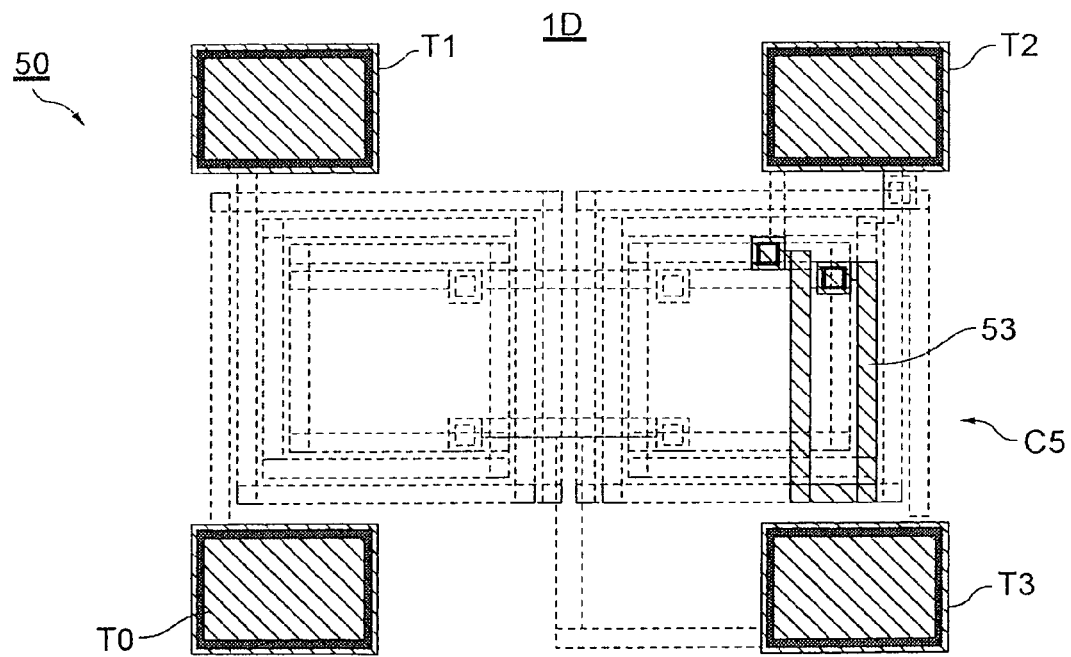
FIG. 11 is a plan view showing the fifth wiring layer 50 of the thin film balun 1D in the comparative example 1D.

In a comparative example 1D, the coil conductors of the auxiliary coil portion C5 are positioned so as to overlap the coil openings of the second coil portion C2 and the fourth coil portion C4. FIGS. 10 and 11 are plan views respectively showing the fourth wiring layer 40 and the fifth wiring layer 50 of a thin film balun 1D in the comparative example 1D. Note that the first wiring layer 10 to the third wiring layer 30 of the thin film balun 1D in the comparative example 1D have the same structures as the example 1A.

As shown in FIGS. 10 and 11, the auxiliary coil portion C5 is constituted by coil conductors 44 and 45 of the fourth wiring layer 40 and a coil conductor 53 of the fifth wiring layer 50. The coil conductors 44, 45, and 53 are respectively obtained by shifting the coil conductors 41, 42, and 51 of the example 1A toward a center of the coil openings A2 and A4. Connection relationships of the coil conductors 44, 45, and 53 are the same as the example 1A.

In the comparative example 1D, the coil conductors 44 and 53 of the auxiliary coil portion C5 are positioned so as to partially overlap the coil opening A2 of the second coil portion C2 and the coil opening A4 of the fourth coil portion C4, as shown in FIGS. 10 and 11.

Comparative Example 1E

Figure 12:
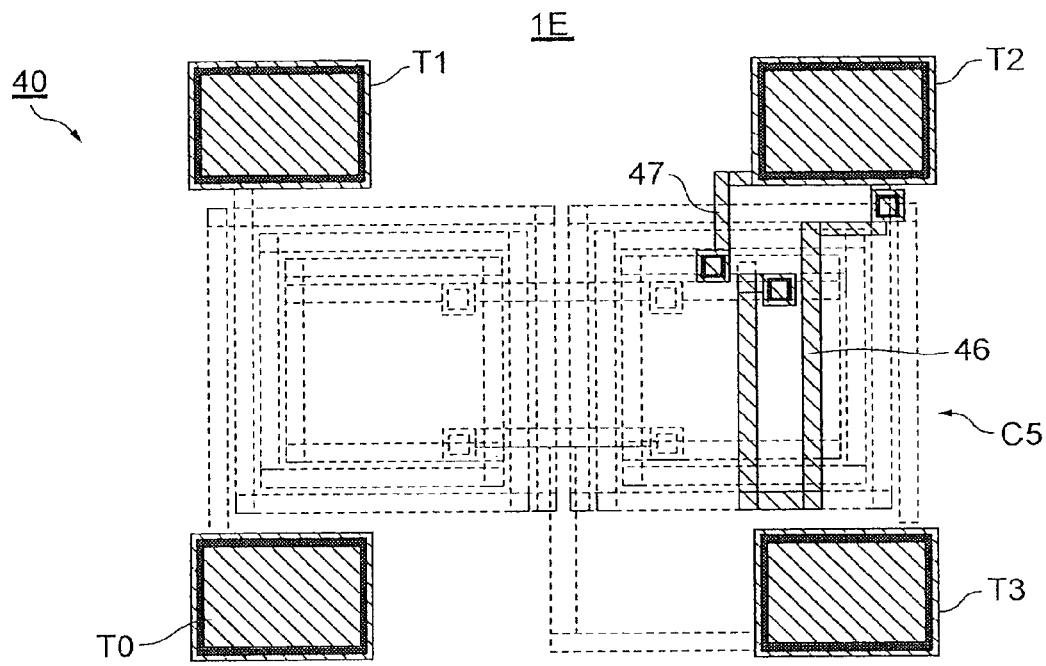
FIG. 12 is a plan view showing the fourth wiring layer 40 of a thin film balun 1E in a comparative example 1E.
Figure 13:
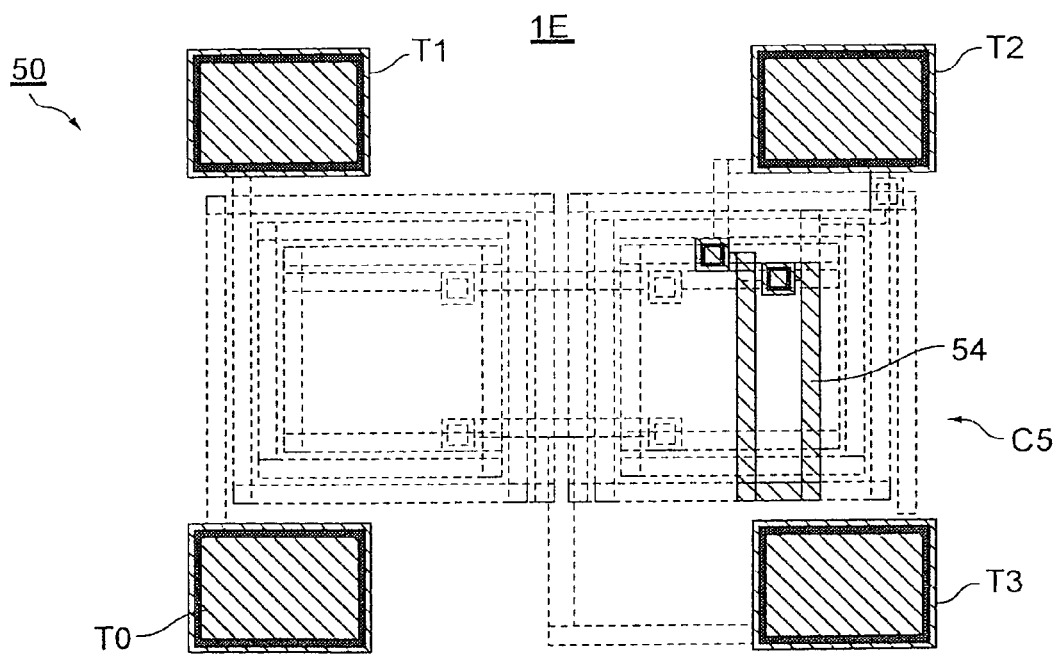
FIG. 13 is a plan view showing the fifth wiring layer 50 of the thin film balun 1E in the comparative example 1E.

In a comparative example 1E, the coil conductors and coil opening of the auxiliary coil portion C5 are positioned so as to overlap the coil opening A2 of the second coil portion C2 and the coil opening A4 of the fourth coil portion C4. FIGS. 12 and 13 are plan views respectively showing the fourth wiring layer 40 and the fifth wiring layer 50 of a thin film balun 1E in the comparative example 1E. Note that the first wiring layer 10 to the third wiring layer 30 of the thin film balun 1E in the comparative example 1E have the same structures as the example 1A.

As shown in FIGS. 12 and 13, the auxiliary coil portion C5 is constituted by coil conductors 46 and 47 of the fourth wiring layer 40 and a coil conductor 54 of the fifth wiring layer 50. The coil conductors 46, 47, and 54 are respectively obtained by further shifting the coil conductors 41, 42, and 51 of the example 1A closer to the center of the coil openings A2 and A4 than the comparative example 1D. Connection relationships of the coil conductors 46, 47, and 54 are the same as the example 1A.

In the comparative example 1E, the coil conductors 46 and 54 and a coil opening defined by the coil conductors 46 and 54 of the auxiliary coil portion C5 are positioned so as to overlap the coil opening A2 of the second coil portion C2 and the coil opening A4 of the fourth coil portion C4, as shown in FIGS. 12 and 13. That is, almost the entire area of the auxiliary coil portion C5 overlaps the coil opening A2 of the second coil portion C2 and the coil opening A4 of the fourth coil portion C4.

(Evaluation Results 1)

Figure 14:
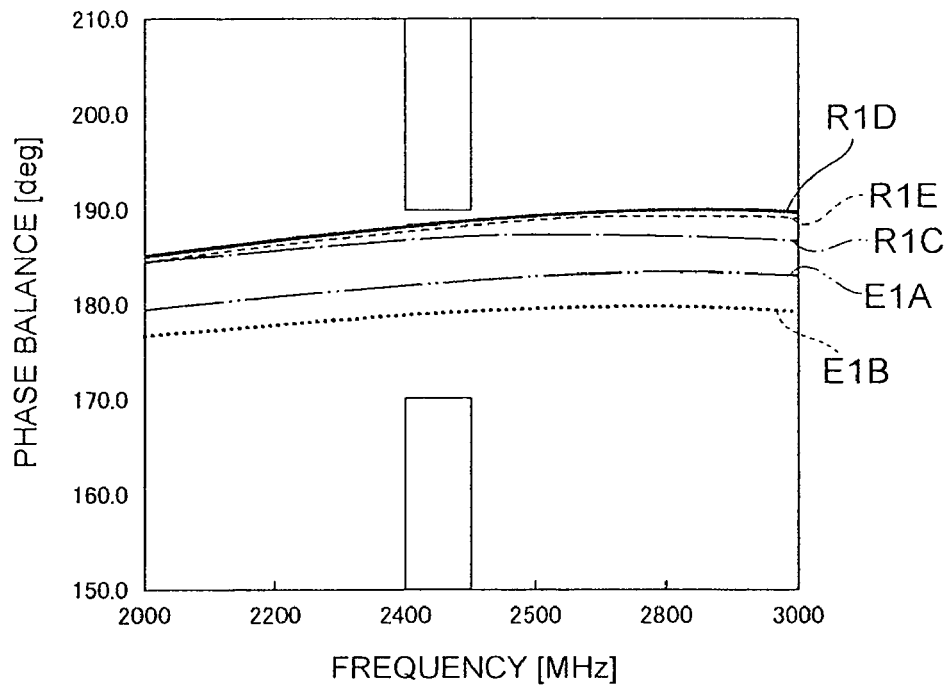
FIG. 14 is a diagram showing phase balance measurement results of the examples 1A and 1B and the comparative examples 1C to 1E.
Figure 15:
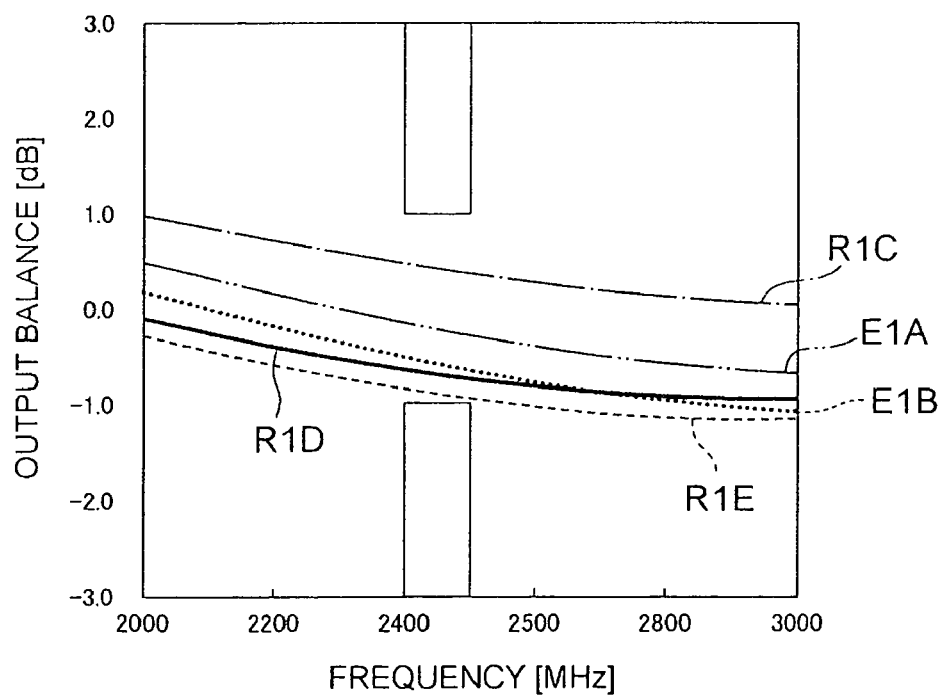
FIG. 15 is a diagram showing output balance measurement results of the examples 1A and 1B and the comparative examples 1C to 1E.

Balance characteristics of the above-mentioned structures of the examples 1A and 1B and the comparative examples 1C to 1E were measured by simulation. Target signal frequencies were set at 2400 MHz to 2500 MHz. FIG. 14 is a diagram showing phase balance measurement results, and FIG. 15 is a diagram showing output (amplitude) balance measurement results. In FIGS. 14 and 15, E1A indicates the result of the example 1A, E1B indicates the result of the example 1B, R1C indicates the result of the comparative example 1C, RID indicates the result of the comparative example 1D, and R1E indicates the result of the comparative example 1E.

Phase balance characteristics are a phase difference between two balanced signals output from the first balanced terminal T1 and the second balanced terminal T2, so that 180 deg is a more ideal phase balance. Output balance characteristics are an amplitude difference between two balanced signals output from the first balanced terminal T1 and the second balanced terminal T2, so that 0 dB is a more ideal output balance.

As can be understood from FIGS. 14 and 15, the example 1A (E1A) in which the auxiliary coil portion C5 is positioned so as to overlap the coil conductor of the second coil portion C2 has most excellent balance characteristics. Though not as excellent as the example 1A, the example 1B (E1B) in which the auxiliary coil portion C5 is positioned outside the area facing the first coil portion C1 to the fourth coil portion C4 also has excellent balance characteristics. On the other hand, the comparative examples 1D and 1E have only similar levels of balance characteristics to the comparative example 1C in which the auxiliary coil portion C5 is not provided.

A reason why such balance characteristics can be achieved is examined below. It is estimated that the addition of the auxiliary coil portion C5 enables the inductance to be adjusted, as a result of which the balance characteristics of the thin film balun can be adjusted and improved. It is also estimated that, when this auxiliary coil portion C5 for adjusting the inductance is positioned so as to overlap the coil openings of the first coil portion C1 to the fourth coil portion C4, the auxiliary coil portion C5 interferes with a magnetic flux passing through the coil openings, which causes the magnetic coupling between the left and right coils to become unbalanced, and results in no improvement in balance characteristics or rather a decrease in balance characteristics.

Another example 1F was further prepared to evaluate how the formation position of the auxiliary coil portion C5 affects the balance characteristics of the thin film balun. The following first describes a layout of the example 1F and then describes evaluation results of its balance characteristics.

Example 1F

Figure 16:
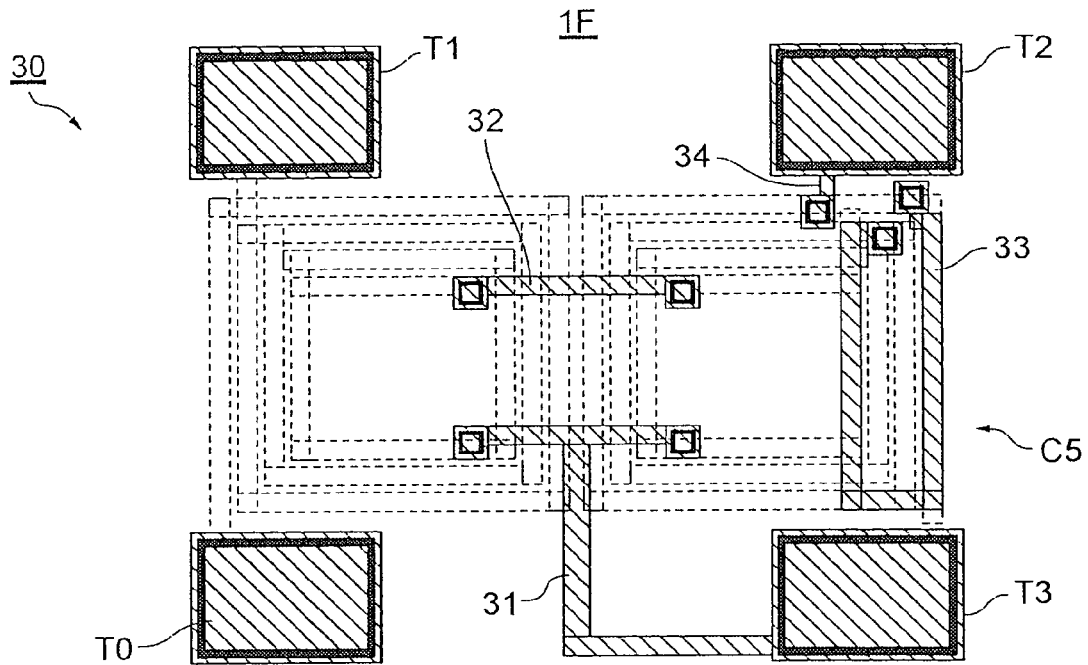
FIG. 16 is a plan view showing the third wiring layer 30 of a thin film balun 1F in an example 1F.
Figure 17:
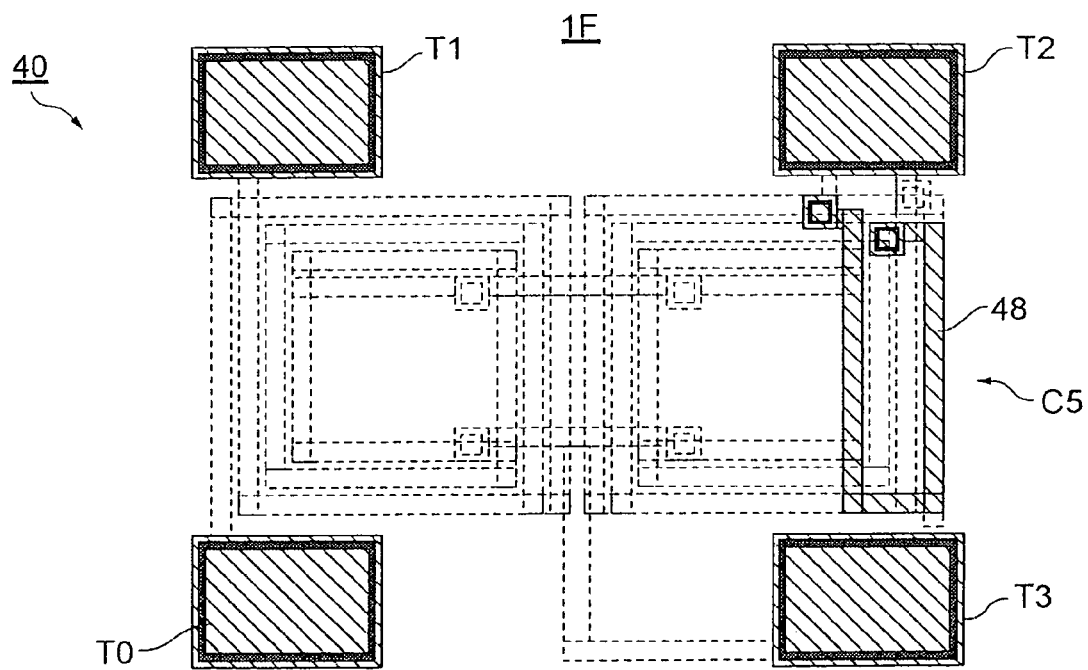
FIG. 17 is a plan view showing the fourth wiring layer 40 of the thin film balun 1F in the example 1F.

In the example 1F, the auxiliary coil portion C5 is formed by the third wiring layer 30 and the fourth wiring layer 40. FIGS. 16 and 17 are plan views respectively showing the third wiring layer 30 and the fourth wiring layer 40 of a thin film balun 1F in the example 1F. Note that the first wiring layer 10 and the second wiring layer 20 of the thin film balun 1F in the example 1F have the same structures as the example 1A. In addition, the fifth wiring layer 50 of the example 1A is unnecessary in the example 1F.

As shown in FIGS. 16 and 17, the auxiliary coil portion C5 is constituted by coil conductors 33, 34, and 48 of the third wiring layer 30 and the fourth wiring layer 40. Connection relationships of the coil conductors 33, 34, and 48 are the same as the coil conductors 41, 42, and 51 in the example 1A.

In the example 1F, the auxiliary coil portion C5 is positioned in an area facing the coil conductors of the second coil portion C2 and the fourth coil portion C4 in the same way as the example 1A, but the auxiliary coil portion C5 is formed on the third wiring layer 30 and the fourth wiring layer 40 to be closer to the first coil portion C1 to the fourth coil portion C4 than in the example 1A, as shown in FIGS. 16 and 17.

(Evaluation Results 2)

Figure 18:
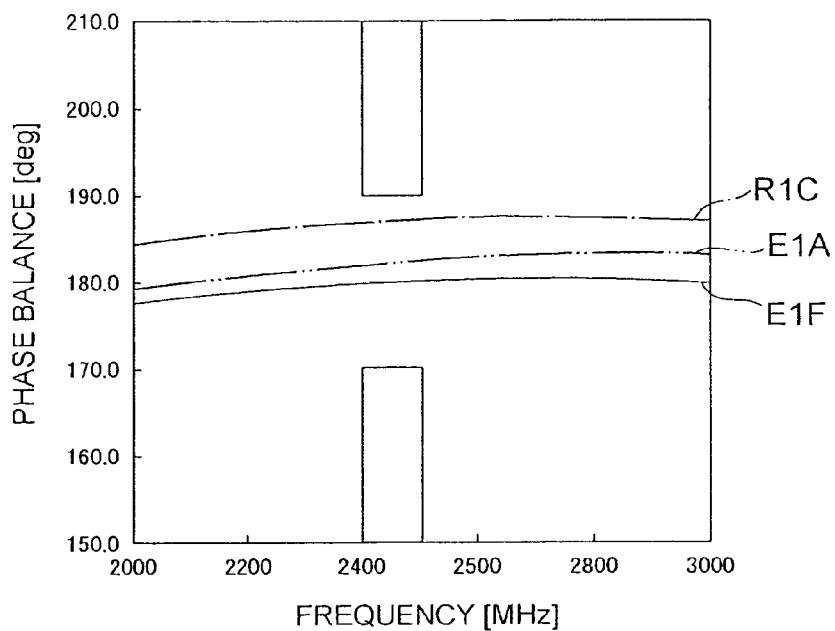
FIG. 18 is a diagram showing phase balance measurement results of the examples 1A and 1F and the comparative example 1C.
Figure 19:
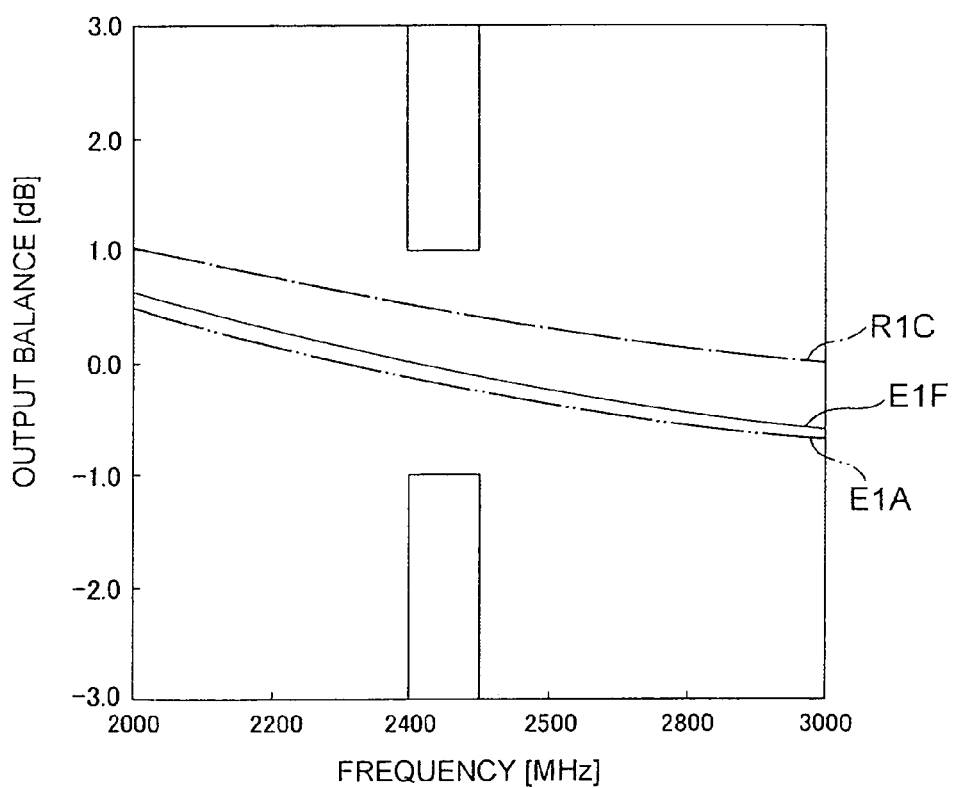
FIG. 19 is a diagram showing output balance measurement results of the examples 1A and 1F and the comparative example 1C.

To evaluate the above-mentioned structure of the example 1F, balance characteristics of the structures of the examples 1A and 1F and the comparative example 1C were measured by simulation. Target signal frequencies were set at 2400 MHz to 2500 MHz. FIG. 18 is a diagram showing phase balance measurement results, and FIG. 19 is a diagram showing output (amplitude) balance measurement results. In FIGS. 18 and 19, E1A indicates the result of the example 1A, E1F indicates the result of the example 1F, and R1C indicates the result of the comparative example 1C.

As can be understood from FIGS. 18 and 19, the example 1F (E1F) has more excellent balance characteristics than the example 1A (E1A).

A reason why such balance characteristics can be achieved is examined below. It is estimated that, by forming the auxiliary coil portion C5 on the third wiring layer 30 and the fourth wiring layer 40 which are closer to the first coil portion C1 to the fourth coil portion C4, a difference in wiring lamination state (bulk) between the left coil portions C1 and C3 and the right coil portions C2, C4, and C5 is reduced to thereby improve a symmetry between the left and right coil portions to some extent, and this symmetrical improvement has an effect of improving the balance characteristics.

Other examples 1G to 1J and comparative example 1K were further prepared to evaluate how the shape and the formation position of the auxiliary coil portion C5 affect the balance characteristics of the thin film balun. The following first describes layouts of the examples 1G to 1J and the comparative example 1K, and then describes evaluation results of their balance characteristics.

Example 1G

Figure 20:
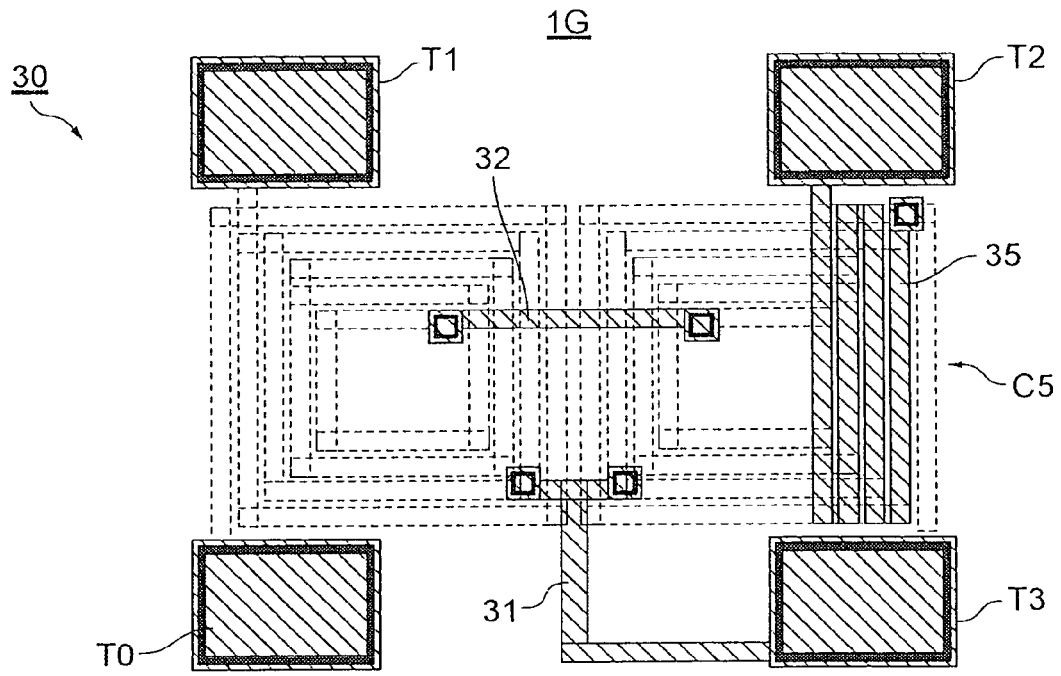
FIG. 20 is a plan view showing the third wiring layer 30 of a thin film balun 1G in an example 1G.

In the example 1G, the auxiliary coil portion C5 is made up of a meandering coil. FIG. 20 is a plan view showing the third wiring layer 30 of a thin film balun 1G in the example 1G. Note that the first wiring layer 10 and the second wiring layer 20 of the example 1G have substantially the same structures as the example 1A, except that the number of turns of the coil conductors on the lowermost first wiring layer 10 is increased by 1 and the number of turns of the coil conductors on the second wiring layer 20 is decreased by 1. In addition, the fourth wiring layer 40 and the fifth wiring layer 50 of the example 1A are unnecessary in the example 1G.

As shown in FIG. 20, the auxiliary coil portion C5 is formed by a zigzag coil conductor 35. One end of the coil conductor 35 is connected to the second balanced terminal T2, and the other end of the coil conductor 35 is connected to the coil conductor 22 of the fourth coil portion C4 via a through hole P. The auxiliary coil portion C5 is positioned so as not to overlap the coil openings of the first coil portion C1 to the fourth coil portion C4. In more detail, the auxiliary coil portion C5 is positioned so as to overlap the coil conductors of the second coil portion C2 and the fourth coil portion C4.

Example 1H

Figure 21:
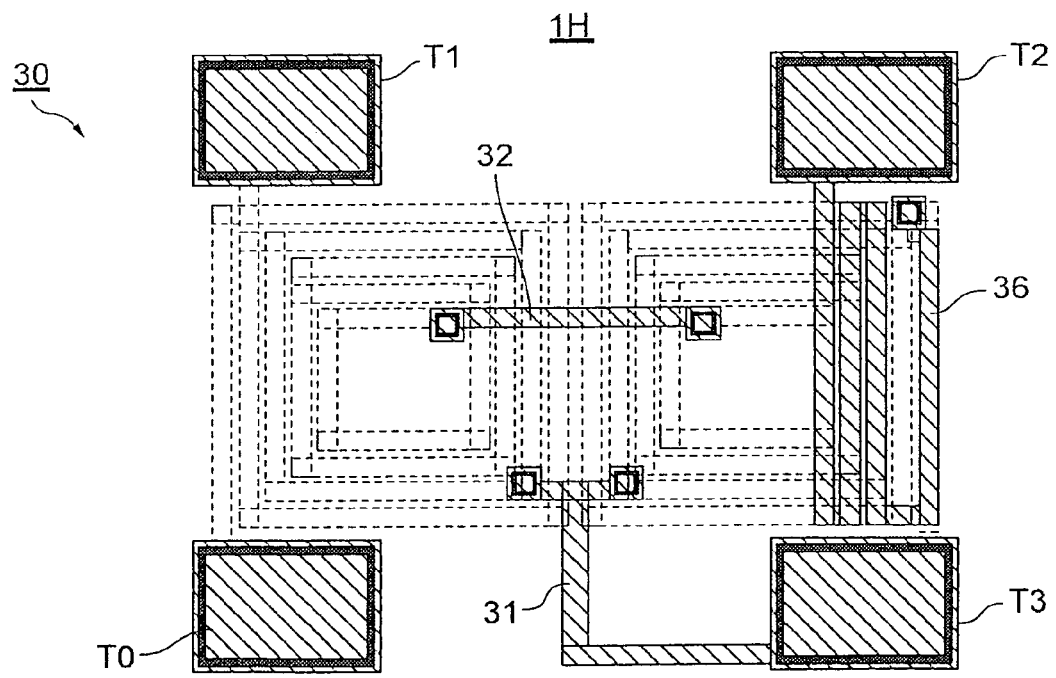
FIG. 21 is a plan view showing the third wiring layer 30 of a thin film balun 1H in an example 1H.

In the example 1H, the area of the meandering auxiliary coil portion C5 is widened. FIG. 21 is a plan view showing the third wiring layer 30 of a thin film balun 1H in the example 1H.

As shown in FIG. 21, the auxiliary coil portion C5 is formed by a zigzag coil conductor 36. The coil conductor 36 is obtained by widening a part of the coil conductor 35 outward. As a result, the coil conductor 36 has a larger inductance than the coil conductor 35. Meanwhile, the auxiliary coil portion C5 of the example 1H is positioned so as not to overlap the coil openings of the first coil portion C1 to the fourth coil portion C4, in the same way as the example 1G. In more detail, the auxiliary coil portion C5 is positioned so as to overlap the coil conductors of the second coil portion C2 and the fourth coil portion C4.

Example 1J

Figure 22:
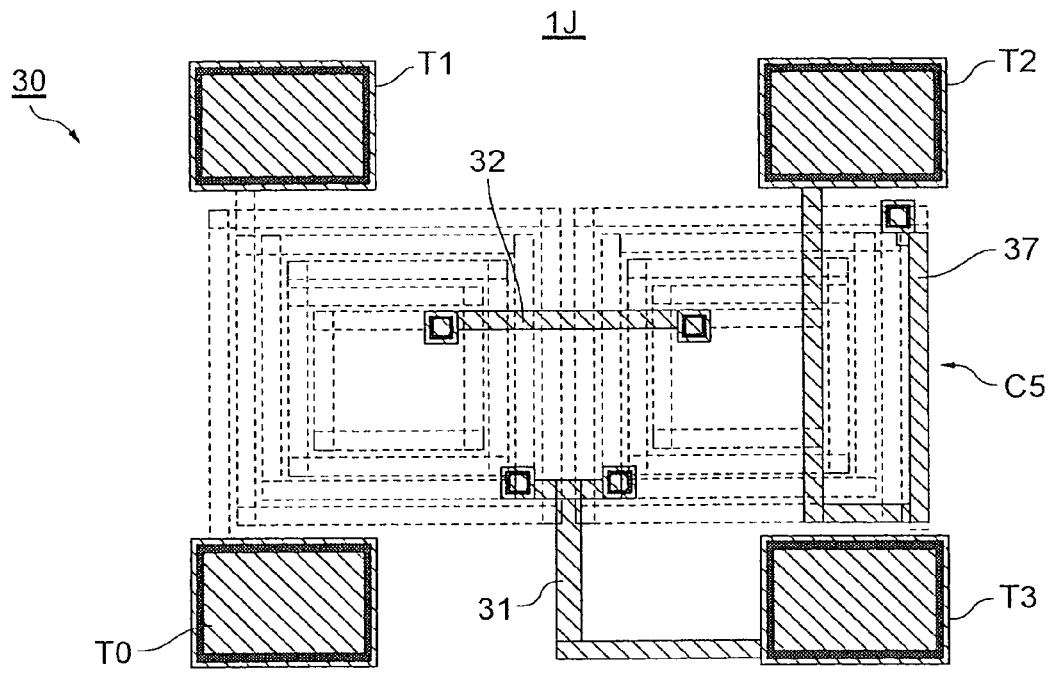
FIG. 22 is a plan view showing the third wiring layer 30 of a thin film balun 1J in an example 1J.

In the example 1J, the auxiliary coil portion C5 is formed only on the third wiring layer 30. FIG. 22 is a plan view showing the third wiring layer 30 of a thin film balun 1J in the example 1J. Note that the first wiring layer 10 and the second wiring layer 20 of the thin film balun 1J in the example 1J have the same structures as the example 1A. In addition, the fourth wiring layer 40 and the fifth wiring layer 50 of the example 1A are unnecessary in the example 1J.

As shown in FIG. 22, the auxiliary coil portion C5 is constituted by a coil conductor 37 of the third wiring layer 30. One end of the coil conductor 37 is connected to the second balanced terminal T2, and the other end of the coil conductor 37 is connected to the coil conductor 22 of the fourth coil portion C4 via a through hole P. The auxiliary coil portion C5 is positioned so as not to overlap the coil openings A1 to A4 of the first coil portion C1 to the fourth coil portion C4. In more detail, the auxiliary coil portion C5 is positioned so as to overlap the coil conductors of the second coil portion C2 and the fourth coil portion C4.

Comparative Example 1K

Figure 23:
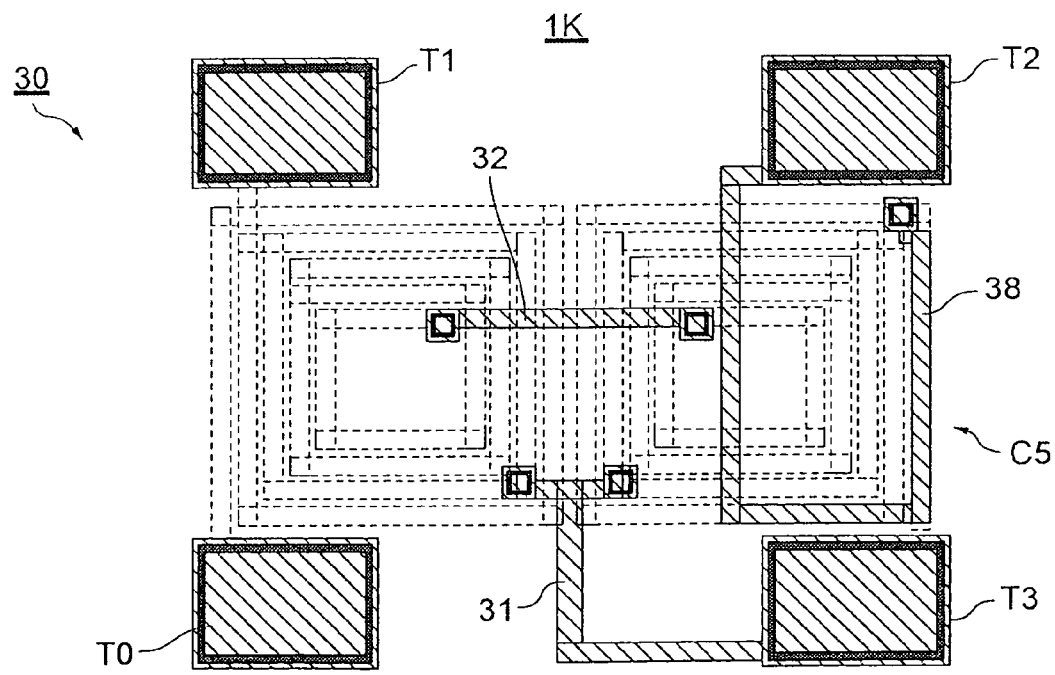
FIG. 23 is a plan view showing the third wiring layer 30 of a thin film balun 1K in a comparative example 1K.

In the comparative example 1K, the shape of the auxiliary coil portion C5 in the example 1J is altered so as to overlap the coil openings. FIG. 23 is a plan view showing the third wiring layer 30 of a thin film balun 1K in the comparative example 1K.

As shown in FIG. 23, a coil conductor 38 constituting the auxiliary coil portion C5 is obtained by shifting a part of the coil conductor 37 in the example 1J toward the coil openings. As a result, the auxiliary coil portion C5 is positioned so as to overlap the right coil openings.

(Evaluation Results 3)

Figure 24:
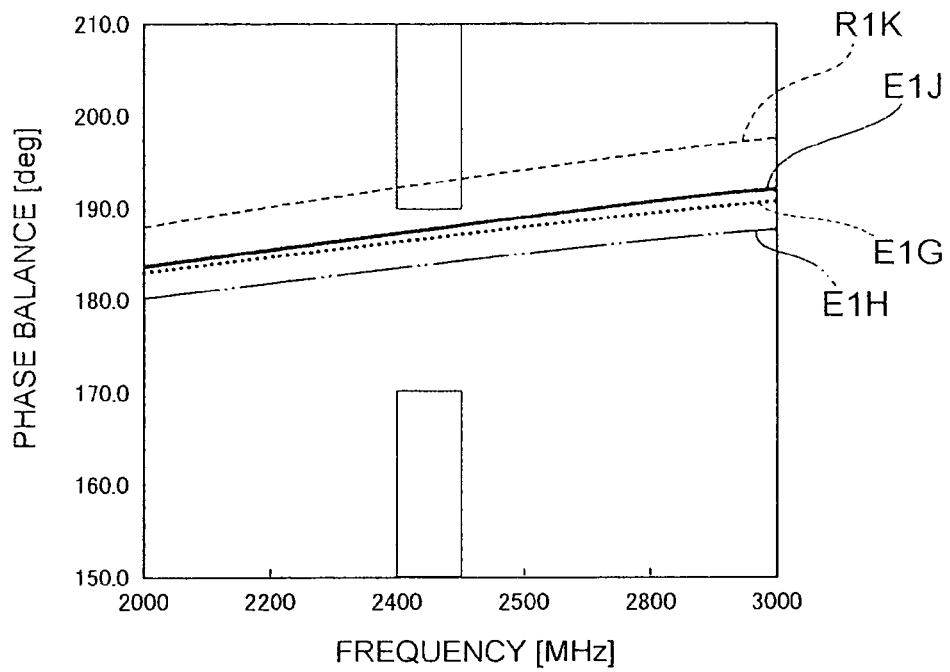
FIG. 24 is a diagram showing phase balance measurement results of the examples 1G to 1J and the comparative example 1K.
Figure 25:
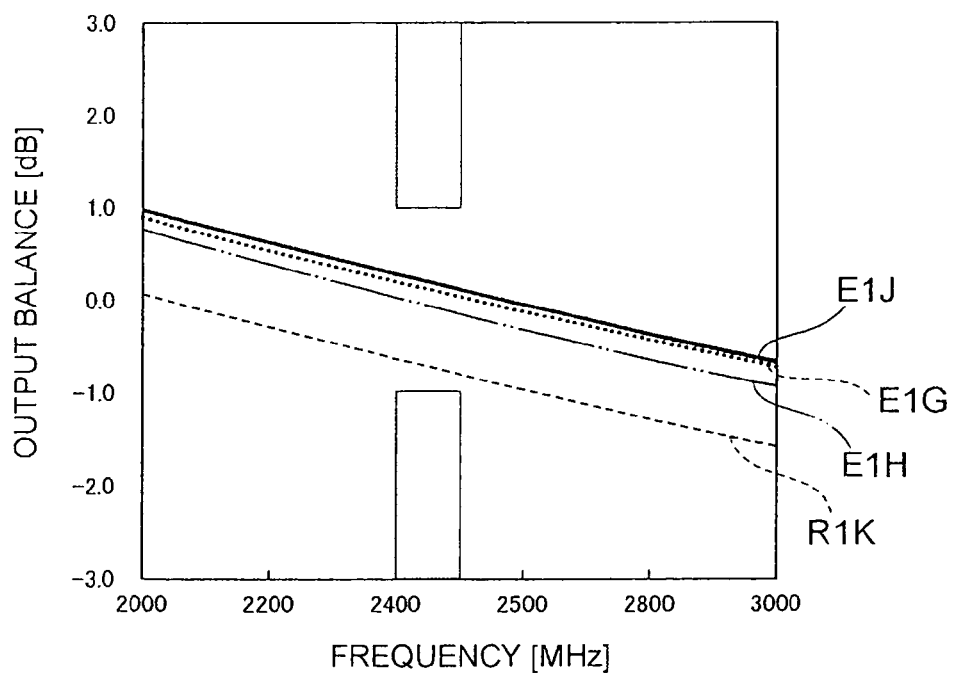
FIG. 25 is a diagram showing output balance measurement results of the examples 1G to 1J and the comparative example 1K.

Balance characteristics of the above-mentioned structures of the examples 1G to 1J and the comparative example 1K were measured by simulation. Target signal frequencies were set at 2400 MHz to 2500 MHz. FIG. 24 is a diagram showing phase balance measurement results, and FIG. 25 is a diagram showing output (amplitude) balance measurement results. In FIGS. 24 and 25, E1G indicates the result of the example 1G, E1H indicates the result of the example 1H, E1J indicates the result of the example 1J, and R1K indicates the result of the comparative example 1K.

As can be understood from FIGS. 24 and 25, the examples 1G to 1J have excellent balance characteristics as compared with the comparative example 1K. These results demonstrate that the auxiliary coil portion C5 may be made up of a zigzag coil conductor or formed annularly by a single wiring layer, so long as the auxiliary coil portion C5 does not overlap the coil openings.

Example 2A

Figure 26:
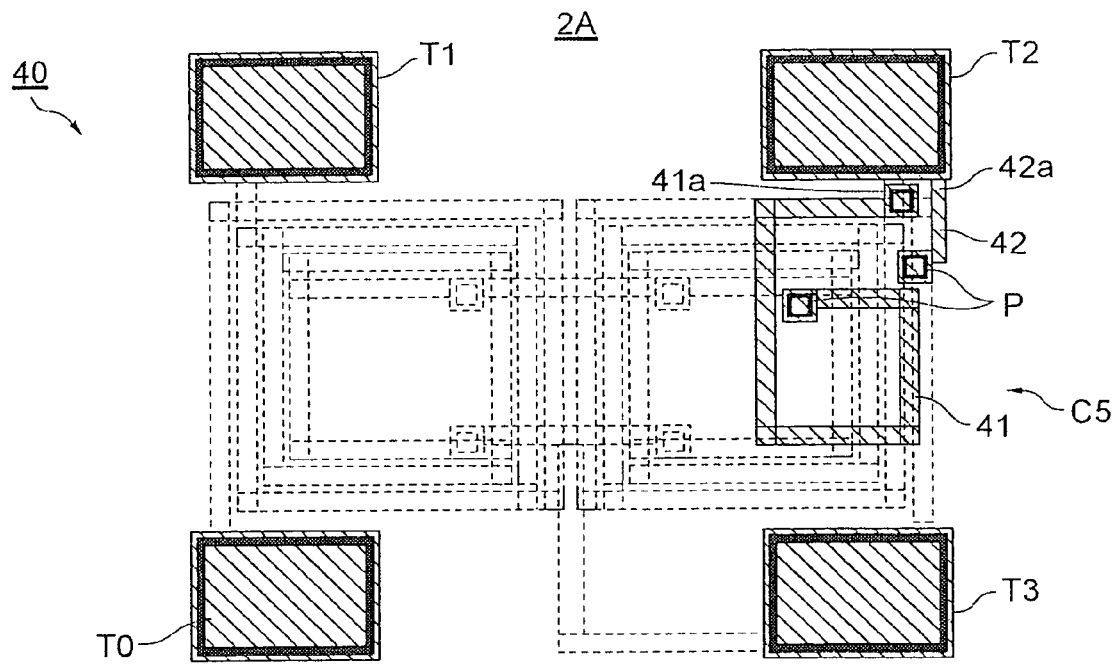
FIG. 26 is a plan view showing the fourth wiring layer 40 of a thin film balun 2A in an example 2A.
Figure 27:
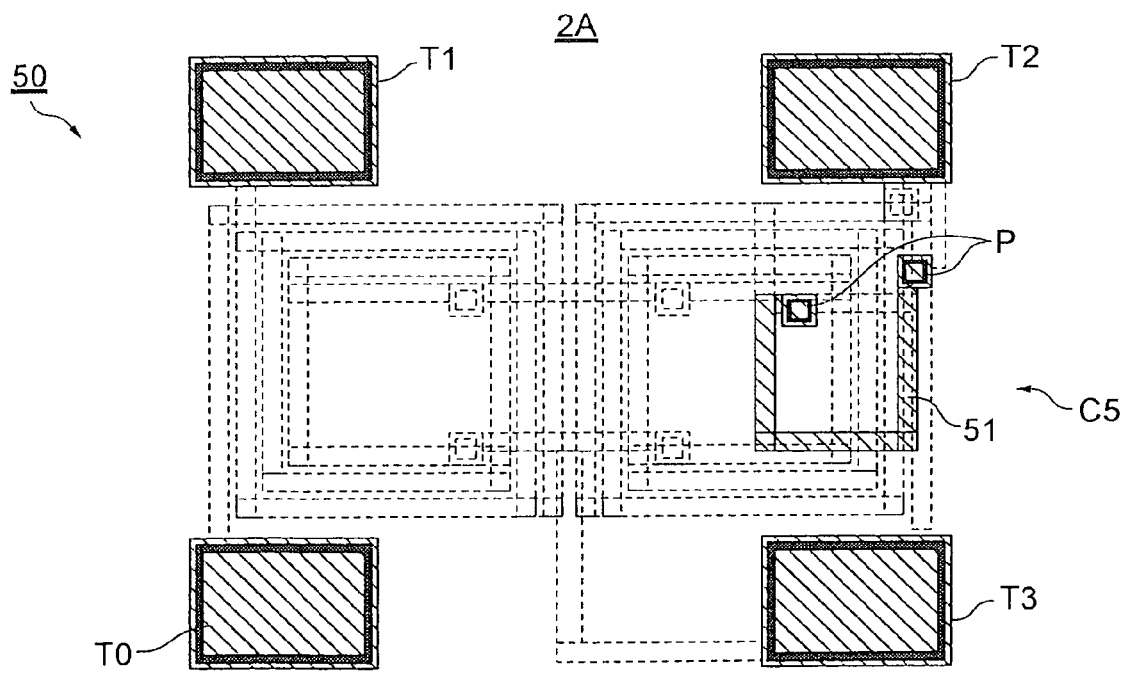
FIG. 27 is a plan view showing the fifth wiring layer 50 of the thin film balun 2A in the example 2A.

In an example 2A, a winding direction of the auxiliary coil portion C5 is specified to improve balance characteristics. FIGS. 26 and 27 are plan views respectively showing the fourth wiring layer 40 and the fifth wiring layer 50 of a thin film balun 2A in the example 2A. Note that the first wiring layer 10 to the third wiring layer 30 of the thin film balun 2A in the example 2A have the same structures as the example 1A.

As shown in FIG. 26, coil conductors 41 and 42 that constitute a part of the auxiliary coil portion C5 are formed on the fourth wiring layer 40. One end 42a of the coil conductor 42 is connected to the second balanced terminal T2, and one end 41a of the coil conductor 41 is connected to the end 22a of the coil conductor 22 constituting the fourth coil portion C4 via a through hole P.

As shown in FIG. 27, a coil conductor 51 that constitutes a part of the auxiliary coil portion C5 is formed on the fifth wiring layer 50. Ends of the coil conductor 51 are each connected to a different one of the other ends of the coil conductors 41 and 42.

As shown in FIGS. 26 and 27, the auxiliary coil portion C5 is formed by connecting the coil conductor 42, the coil conductor 51, and the coil conductor 41 via through holes P. The end 42a of the coil conductor 42, which is one end of the auxiliary coil portion C5, is connected to the second balanced terminal T2, and the end 41a of the coil conductor 41, which is the other end of the auxiliary coil portion C5, is connected to the coil conductor 22 of the fourth coil portion C4.

As described above, in the thin film balun 2A of the example 2A, the auxiliary coil portion C5 is electrically connected between the fourth coil portion C4 and the second balanced terminal T2. Moreover, the winding direction of the auxiliary coil portion C5 is different from a winding direction of the coil portions C1 and C2 constituting the unbalanced transmission line 2. In more detail, the winding direction of the auxiliary coil portion C5 is opposite to the winding direction of the coil portions C1 and C2. Here, a winding direction is determined with respect to the unbalanced terminal T0, when the thin film balun 2A is viewed from above the substrate. In this case, the first coil portion C1 and the second coil portion C2 are right-handed (clockwise), the third coil portion C3 and the fourth coil portion C4 with the first balanced terminal T1 as a start point are left-handed (counterclockwise), and the auxiliary coil portion C5 with the connecting point with the fourth coil portion C4 as a start point is left-handed. Hence the winding direction of the auxiliary coil portion C5 is opposite to the winding direction of the second coil portion C2 constituting the unbalanced transmission line 2.

The above describes the example where, to the thin film balun structure in which the two coils C1 and C2 constituting the unbalanced transmission line are formed on the same first layer, the two coils C3 and C4 constituting the balanced transmission line are formed on the second layer that is another layer adjacent to the first layer, and the wire connecting the coils C1 and C2 and the wire connecting the coils C3 and C4 are formed on the third layer that is adjacent to the second layer on an opposite side to the first layer, the auxiliary coil C5 is additionally formed using the two layers, namely, the fourth layer that is adjacent to the third layer on an opposite side to the second layer and the fifth layer that is adjacent to the fourth layer on an opposite side to the third layer. However, the auxiliary coil may instead be formed using the third layer and the fourth layer. This changes a magnetic coupling state, as a result of which further improvements in characteristics can be expected.

Needless to say, the auxiliary coil is not limited to two layers, and may be formed only on one layer such as the fourth layer or the third layer. Design can be made according to desired characteristics.

Various examples and comparative examples were prepared to evaluate how the winding direction of the auxiliary coil portion C5 affects the balance characteristics of the thin film balun. The following first describes layouts of the various examples and comparative examples, and then describes evaluation results of their balance characteristics.

Example 2B

Figure 28:
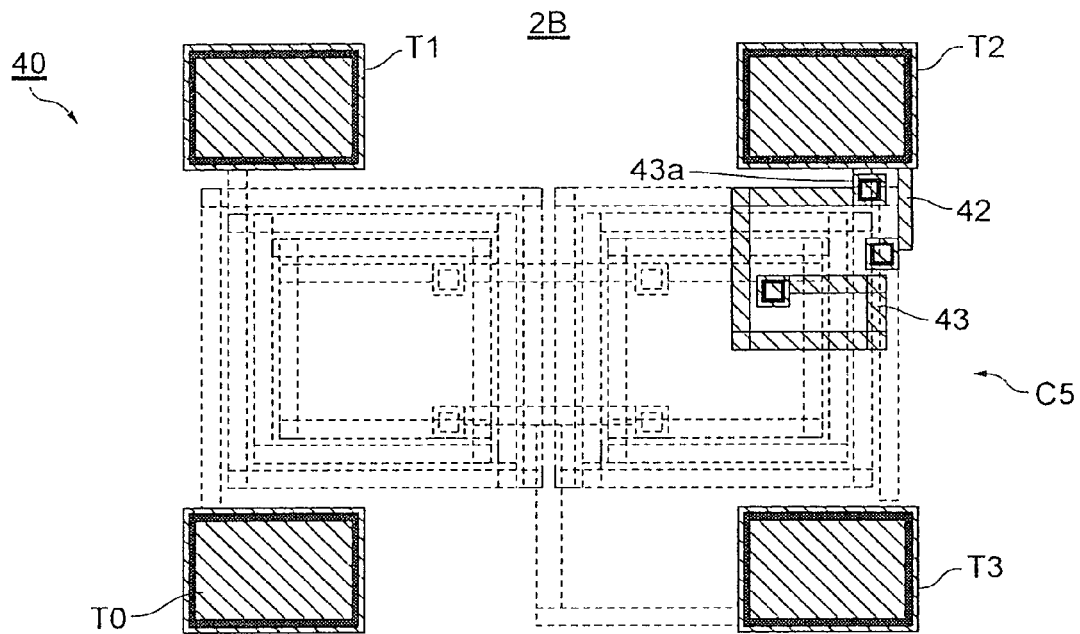
FIG. 28 is a plan view showing the fourth wiring layer 40 of a thin film balun 2B in an example 2B.
Figure 29:
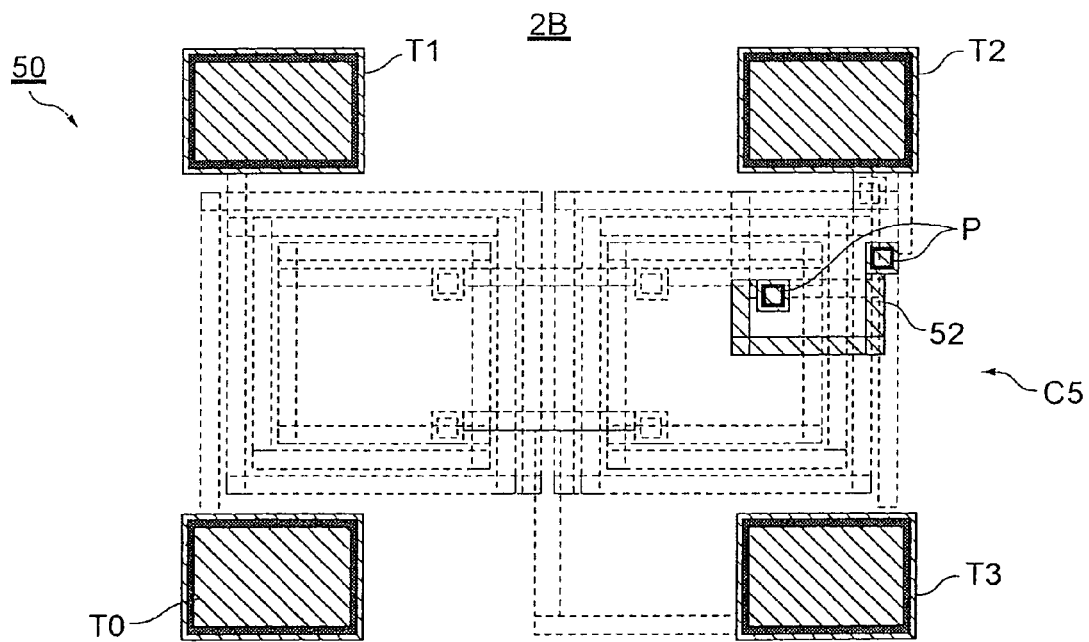
FIG. 29 is a plan view showing the fifth wiring layer 50 of the thin film balun 2B in the example 2B.

In an example 2B, the coil conductors are shortened as compared with the example 2A, thereby decreasing the inductance of the auxiliary coil portion C5. FIGS. 28 and 29 are plan views respectively showing the fourth wiring layer 40 and the fifth wiring layer 50 of a thin film balun 2B in the example 2B. Note that the first wiring layer 10 to the third wiring layer 30 of the thin film balun 2B in the example 2B have the same structures as the example 1A.

As shown in FIGS. 28 and 29, coil conductors 43 and 52 constituting the auxiliary coil portion C5 of the example 2B are obtained by shortening the coil conductors 41 and 51 of the example 2A upward in the drawings, as a result of which the inductance of the auxiliary coil portion C5 is decreased. Connection relationships of the coil conductors 42, 43, and 52 are the same as the coil conductors 42, 41, and 51 of the example 2A.

Comparative Example 2C

Figure 30:
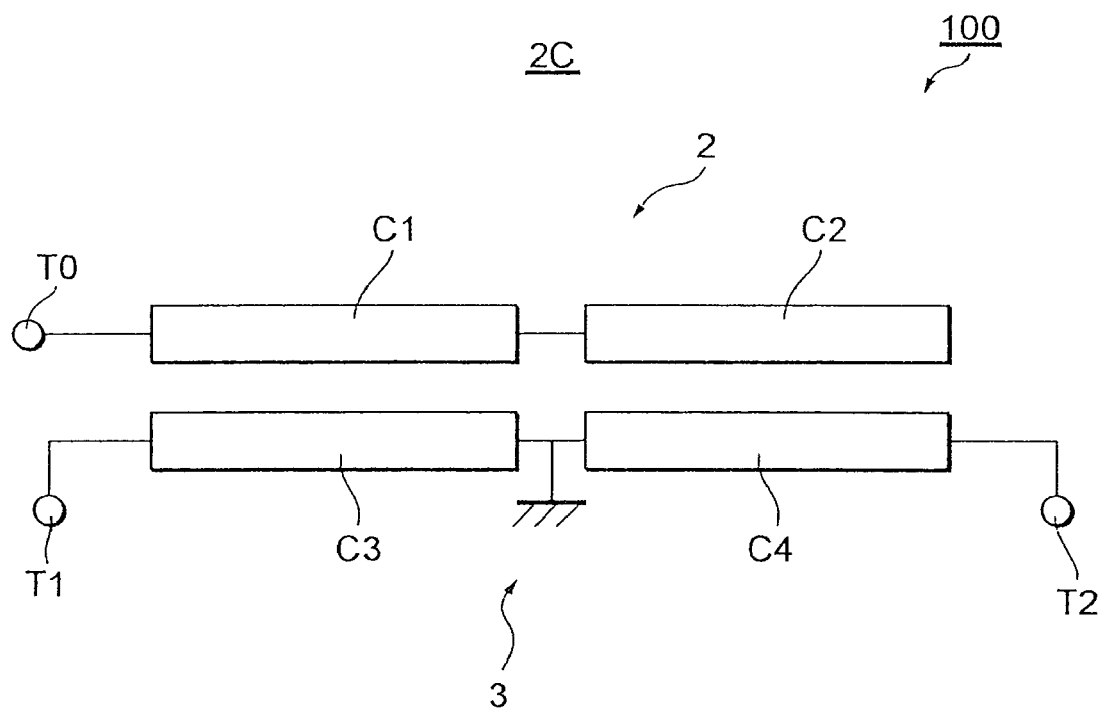
FIG. 30 is an equivalent circuit diagram of a thin film balun 2C in a comparative example 2C.

FIG. 30 is an equivalent circuit diagram of a thin film balun 2C in a comparative example 2C. The thin film balun 2C of the comparative example 2C does not have the auxiliary coil portion C5 between the fourth coil portion C4 and the second balanced terminal T2. In detail, the thin film balun 2C of the comparative example 2C has a structure in which the end 22a of the coil conductor 22 of the second wiring layer 20 shown in FIG. 3 is connected to the second balanced terminal T2, and the coil conductors 41, 42, and 51 of the fourth wiring layer 40 and the fifth wiring layer 50 shown in FIGS. 26 and 27 are omitted.

Comparative Example 2D

In a comparative example 2D, the winding direction of the auxiliary coil portion C5 is reversed as compared with the example 2A. FIGS. 31 and 32 are plan views respectively showing the fourth wiring layer 40 and the fifth wiring layer 50 of a thin film balun 2D in the comparative example 2D. Note that the first wiring layer 10 to the third wiring layer 30 of the thin film balun 2D in the comparative example 2D have the same structures as the example 1A.

As shown in FIGS. 31 and 32, the winding direction of the auxiliary coil portion C5 constituted by coil conductors 45, 46, and 54 of the comparative example 2D is opposite to the winding direction of the auxiliary coil portion C5 of the example 2A, and therefore is right-handed (clockwise) which is the same as the winding direction of the second coil portion C2 constituting the unbalanced transmission line 2.

(Evaluation Results 1)

Figure 33:
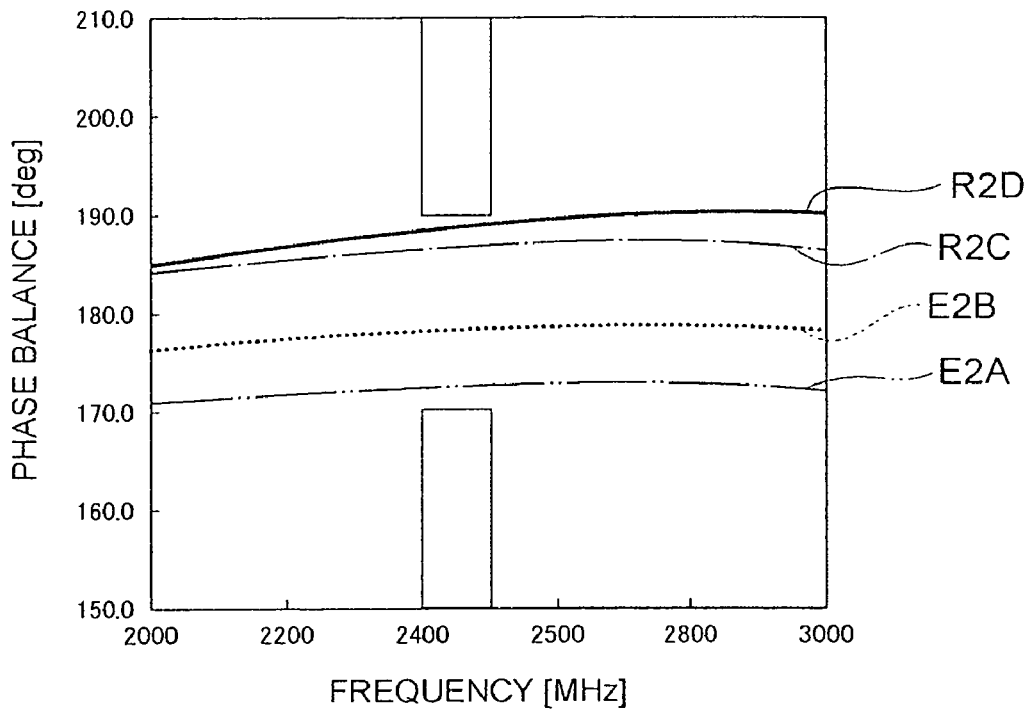
FIG. 33 is a diagram showing phase balance measurement results of the examples 2A and 2B and the comparative examples 2C and 2D.
Figure 34:
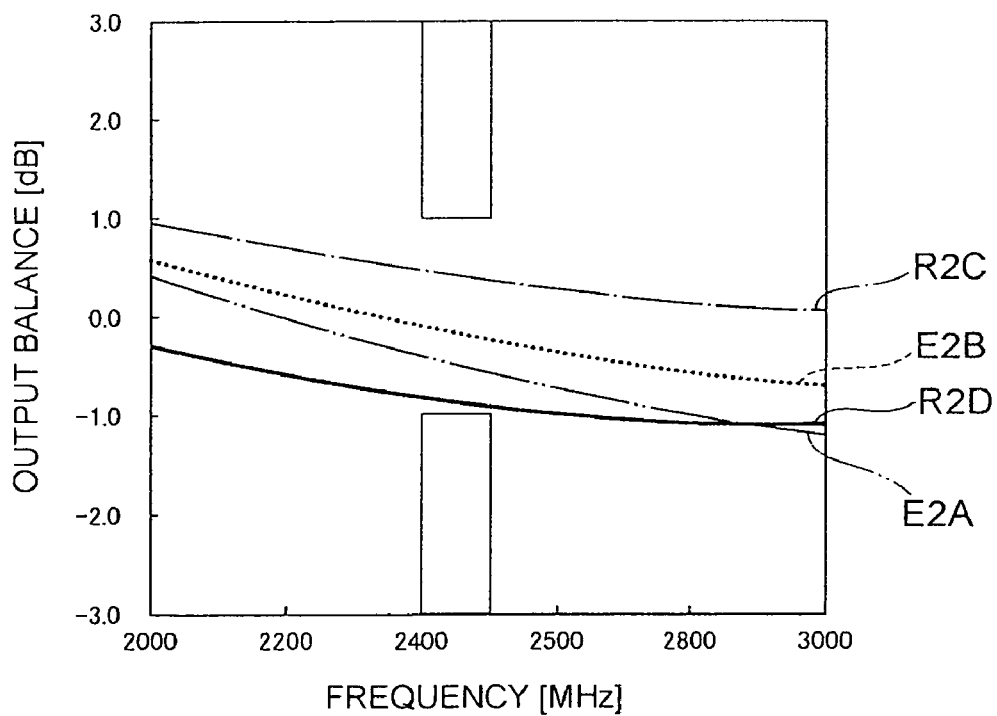
FIG. 34 is a diagram showing output balance measurement results of the examples 2A and 2B and the comparative examples 2C and 2D.
Figure 35:
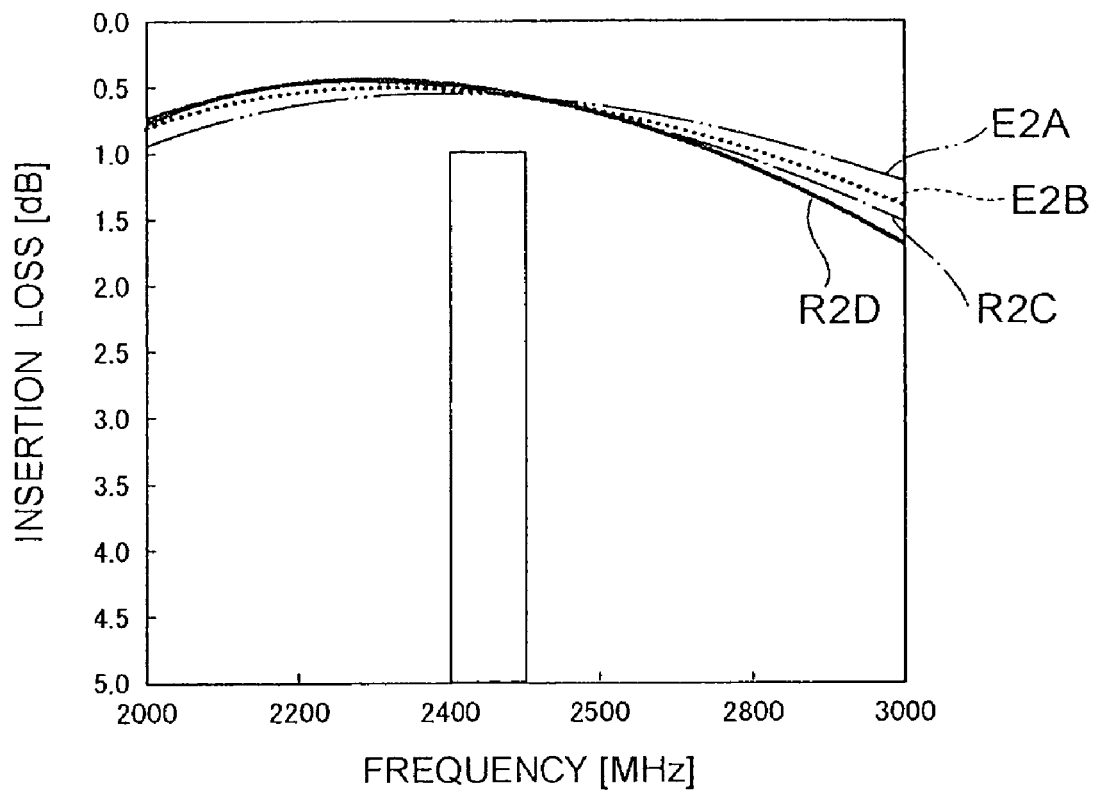
FIG. 35 is a diagram showing insertion loss measurement results of the examples 2A and 2B and the comparative examples 2C and 2D.

Balance characteristics of the above-mentioned structures of the examples 2A and 2B and the comparative examples 2C and 2D were measured by simulation. Target signal frequencies were set at 2400 MHz to 2500 MHz. FIG. 33 is a diagram showing phase balance measurement results, FIG. 34 is a diagram showing output (amplitude) balance measurement results, and FIG. 35 is a diagram showing insertion loss. In FIGS. 33 to 35, E2A indicates the result of the example 2A, E2B indicates the result of the example 2B, R2C indicates the result of the comparative example 2C, and R2D indicates the result of the comparative example 2D.

Phase balance characteristics are a phase difference between two balanced signals output from the first balanced terminal T1 and the second balanced terminal T2, so that 180 deg is a more ideal phase balance. Output balance characteristics are an amplitude difference between two balanced signals output from the first balanced terminal T1 and the second balanced terminal T2, so that 0 dB is a more ideal output balance. Insertion loss represent with how little loss a signal passes through. 0 dB is ideal insertion loss at least in used signal frequencies.

As can be understood from FIGS. 33 and 34, the example 2A (E2A) has excellent balance characteristics as compared with the comparative examples 2C and 2D. Moreover, the balance characteristics can be adjusted by adjusting the inductance of the coil, as can be seen in the example 2B (E2B). In the present case, the example 2B in which the inductance is decreased as compared with the example 2A exhibits most excellent balance characteristics.

In addition, as can be understood from FIG. 35, the examples 2A and 2B have insertion loss with a loss no more than 1 dB in a frequency range of 2000 MHz to 2800 MHz centered on the target signal frequencies of 2400 MHz to 2500 MHz. As a result of shifting a peak of insertion loss toward higher frequencies as compared with the comparative examples R2C and R2D, the insertion loss around the 2.4 G band surpass desired specifications in a wide range. That is, a frequency pass band is widened.

A reason why such balance characteristics can be achieved is examined below. It is estimated that the addition of the auxiliary coil portion C5 enables the inductance to be adjusted, as a result of which the balance characteristics of the thin film balun can be improved. It is also estimated that, when the winding direction of the auxiliary coil portion C5 is opposite to that of the second coil portion C2, a vector of a magnetic flux generated by a current flowing through the second coil portion C2 and a vector of a magnetic flux generated by a current flowing through the auxiliary coil portion C5 are opposite in direction, which weakens the magnetic coupling of the entire balanced-unbalanced circuit and as a result contributes to an improvement in balance characteristics, though detailed action mechanisms are not clear.

Other examples 2E to 2H were further prepared to evaluate how the formation position of the auxiliary coil portion C5 affects the balance characteristics of the thin film balun. The following first describes layouts of the examples 2E to 2H and then describes evaluation results of their balance characteristics.

Example 2E

Figure 36:
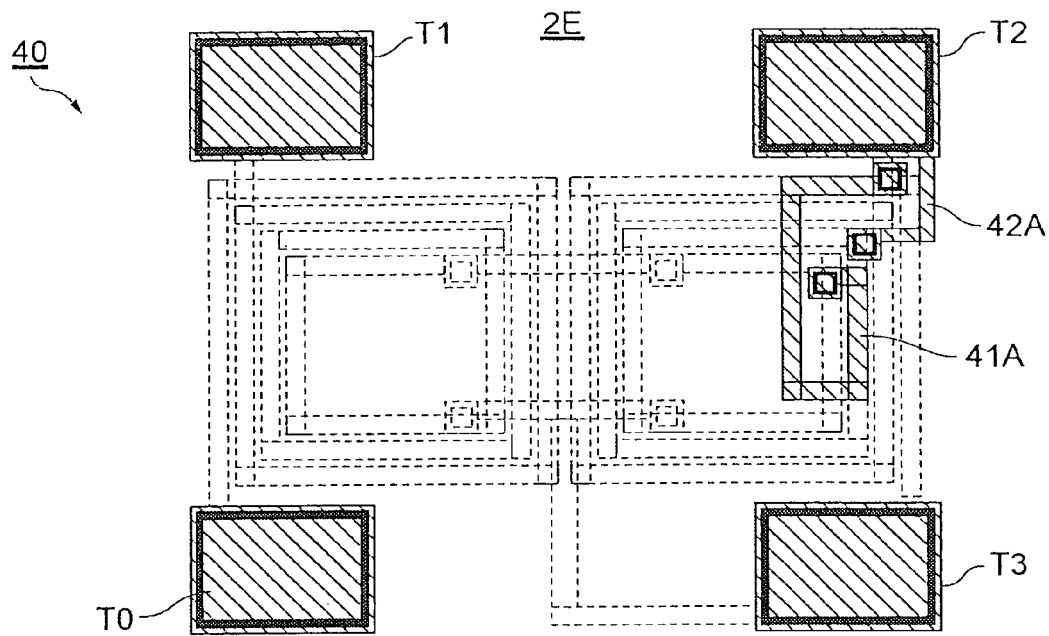
FIG. 36 is a plan view showing the fourth wiring layer 40 of a thin film balun 2E in an example 2E.
Figure 37:
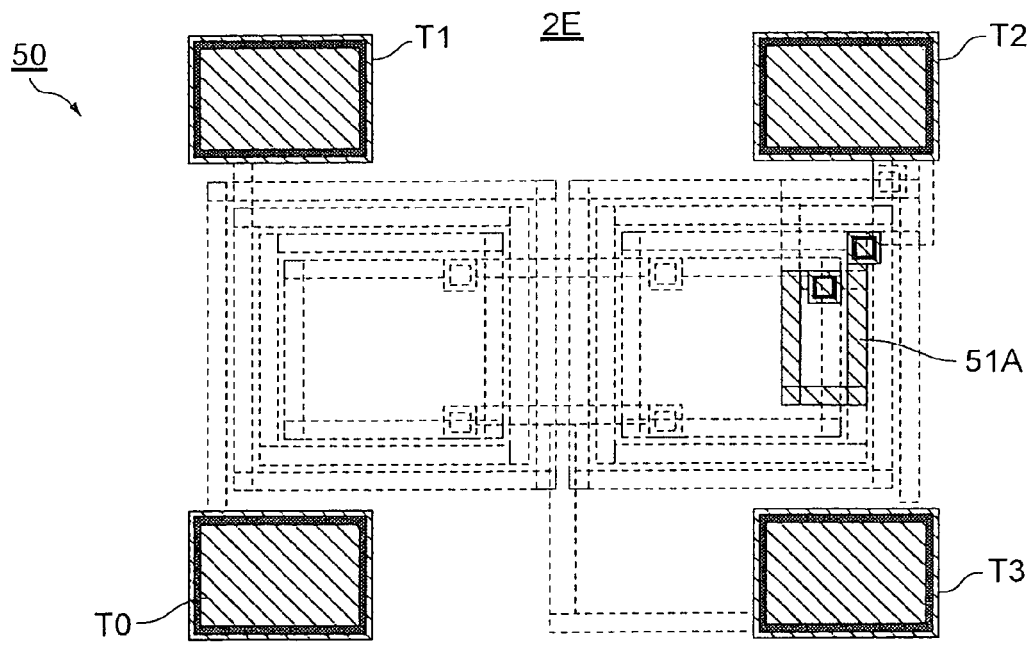
FIG. 37 is a plan view showing the fifth wiring layer 50 of the thin film balun 2E in the example 2E.

In the example 2E, the coil conductors of the auxiliary coil portion C5 are positioned so as to overlap the coil openings of the second coil portion C2 and the fourth coil portion C4. FIGS. 36 and 37 are plan views respectively showing the fourth wiring layer 40 and the fifth wiring layer 50 of a thin film balun 2E in the example 2E. Note that the first wiring layer 10 to the third wiring layer 30 of the thin film balun 2E in the example 2E have the same structures as the example 1A.

As shown in FIGS. 36 and 37, the auxiliary coil portion C5 is constituted by coil conductors 41A and 42A of the fourth wiring layer 40 and a coil conductor 51A of the fifth wiring layer 50. The coil conductors 41A, 42A, and 51A are respectively obtained by shifting the coil conductors 41, 42, and 51 of the example 2A. Connection relationships of the coil conductors 41A, 42A, and 51A are the same as the example 2A.

In the example 2E, the coil conductors 41A and 51A of the auxiliary coil portion C5 are positioned so as to overlap the coil openings of the second coil portion C2 and the fourth coil portion C4, as shown in FIGS. 36 and 37.

Example 2F

Figure 38:
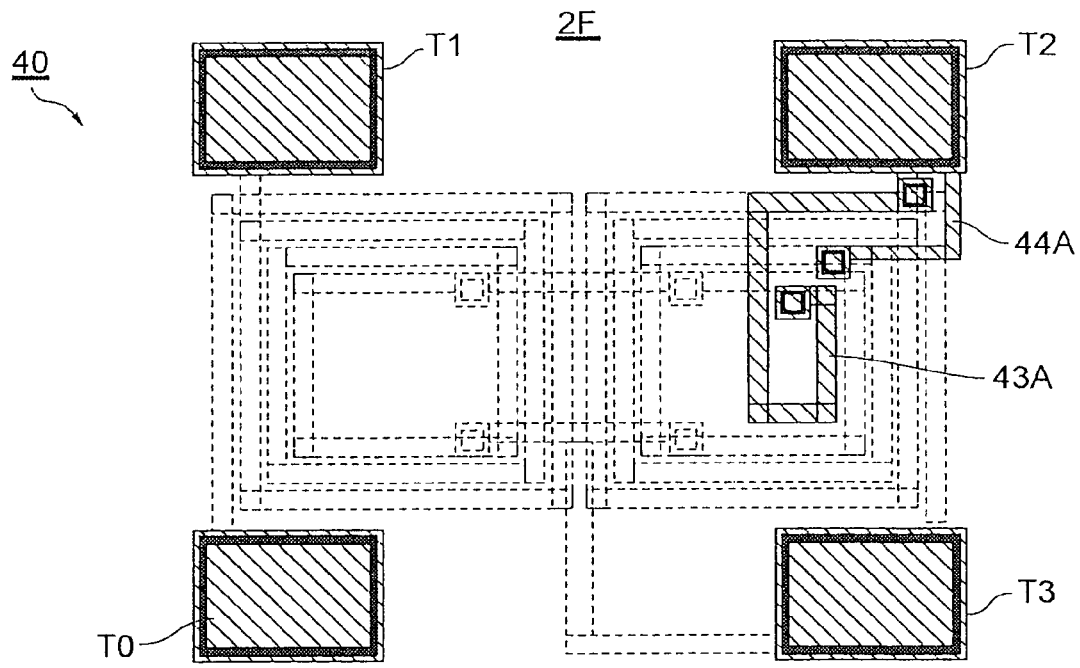
FIG. 38 is a plan view showing the fourth wiring layer 40 of a thin film balun 2F in an example 2F.
Figure 39:
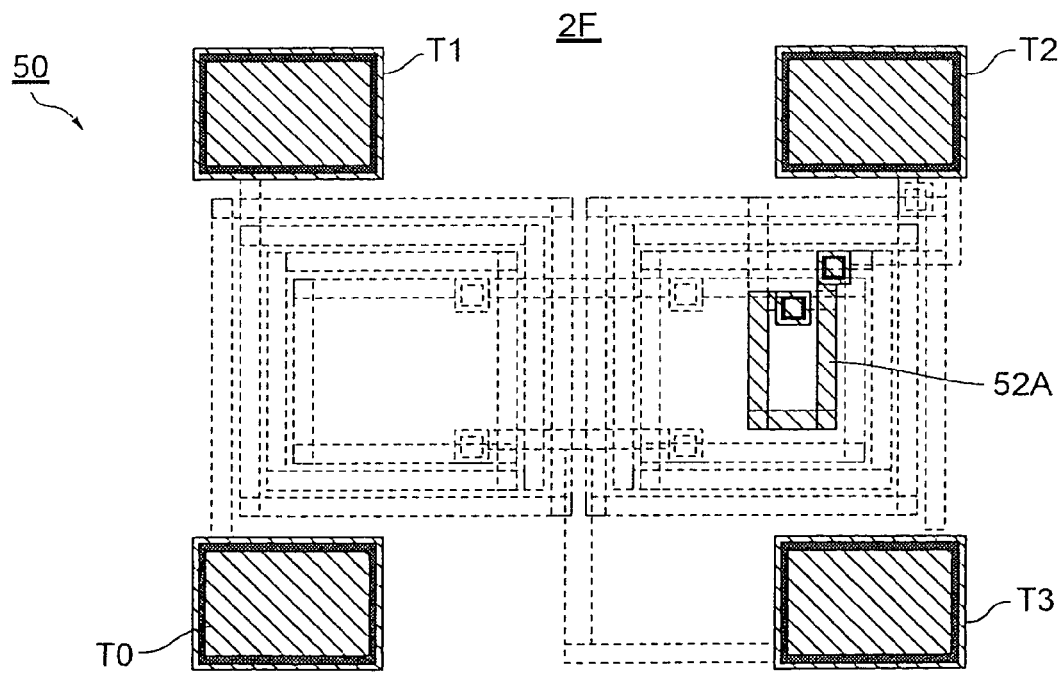
FIG. 39 is a plan view showing the fifth wiring layer 50 of the thin film balun 2F in the example 2F.

In the example 2F, the coil conductors and the coil opening of the auxiliary coil portion C5 are positioned so as to overlap the coil openings of the second coil portion C2 and the fourth coil portion C4. FIGS. 38 and 39 are plan views respectively showing the fourth wiring layer 40 and the fifth wiring layer 50 of a thin film balun 2F in the example 2F. Note that the first wiring layer 10 to the third wiring layer 30 of the thin film balun 2F in the example 2F have the same structures as the example 1A.

As shown in FIGS. 38 and 39, the auxiliary coil portion C5 is constituted by coil conductors 43A and 44A of the fourth wiring layer 40 and a coil conductor 52A of the fifth wiring layer 50. The coil conductors 43A, 44A, and 52A are respectively obtained by shifting the coil conductors 41, 42, and 51 of the example 2A toward the coil openings further than the example 2E. Connection relationships of the coil conductors 43A, 44A, and 52A are the same as the example 2A.

In the example 2F, the coil conductors and the coil opening of the auxiliary coil portion C5 are positioned so as to overlap the coil openings of the second coil portion C2 and the fourth coil portion C4, as shown in FIGS. 38 and 39. That is, almost the entire area of the auxiliary coil portion C5 overlaps the coil openings of the second coil portion C2 and the fourth coil portion C4.

Example 2G

Figure 40:
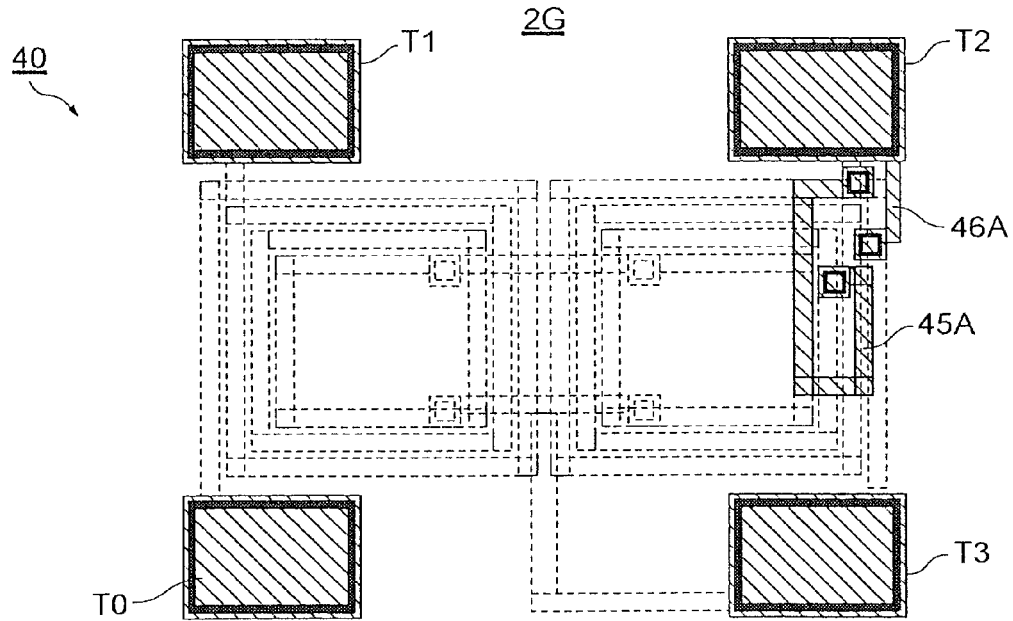
FIG. 40 is a plan view showing the fourth wiring layer 40 of a thin film balun 2G in an example 2G.
Figure 41:
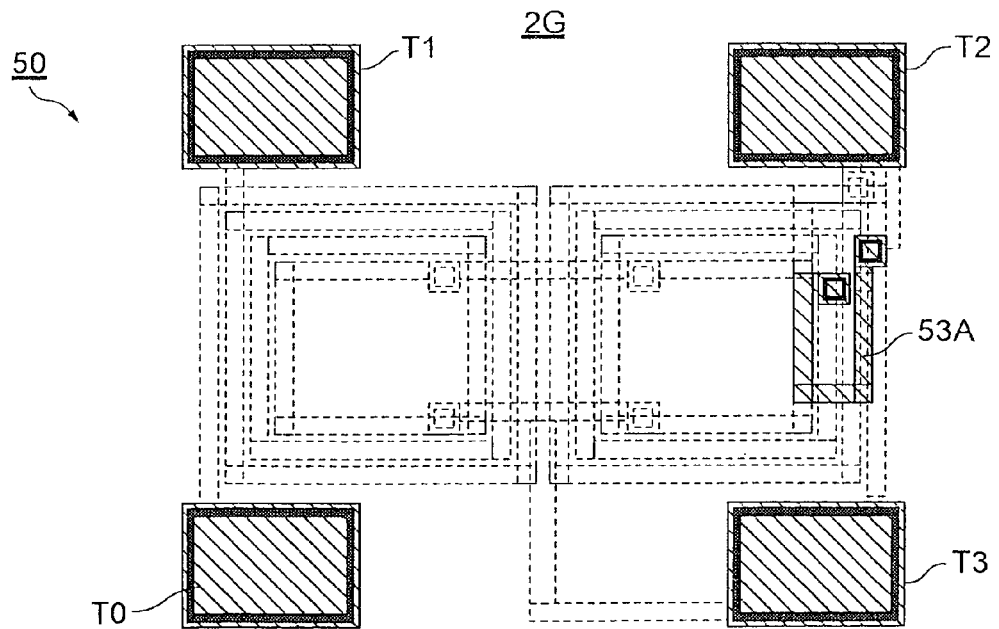
FIG. 41 is a plan view showing the fifth wiring layer 50 of the thin film balun 2G in the example 2G.

In the example 2G, the coil conductors and the coil opening of the auxiliary coil portion C5 are positioned so as to overlap the coil conductors of the second coil portion C2 and the fourth coil portion C4. FIGS. 40 and 41 are plan views respectively showing the fourth wiring layer 40 and the fifth wiring layer 50 of a thin film balun 2G in the example 2G. Note that the first wiring layer 10 to the third wiring layer 30 of the thin film balun 2G in the example 2G have the same structures as the example 1A.

As shown in FIGS. 40 and 41, the auxiliary coil portion C5 is constituted by coil conductors 45A and 46A of the fourth wiring layer 40 and a coil conductor 53A of the fifth wiring layer 50. The coil conductors 45A, 46A, and 53A are respectively obtained by shifting the coil conductors 41, 42, and 51 of the example 2A to be situated above the coil conductor of the second coil portion C2. Connection relationships of the coil conductors 45A, 46A, and 53A are the same as the example 2A.

In the example 2G, the auxiliary coil portion C5 is positioned in an area facing the coil conductors of the second coil portion C2 and the fourth coil portion C4, as shown in FIGS. 40 and 41.

Example 2H

Figure 42:
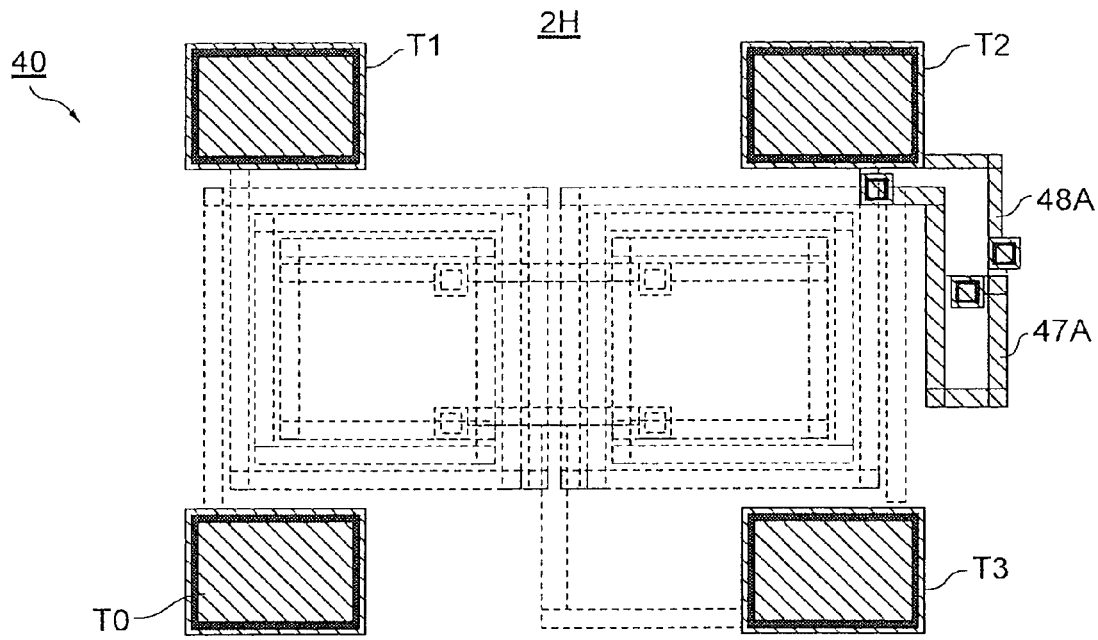
FIG. 42 is a plan view showing the fourth wiring layer 40 of a thin film balun 2H in an example 2H.
Figure 43:
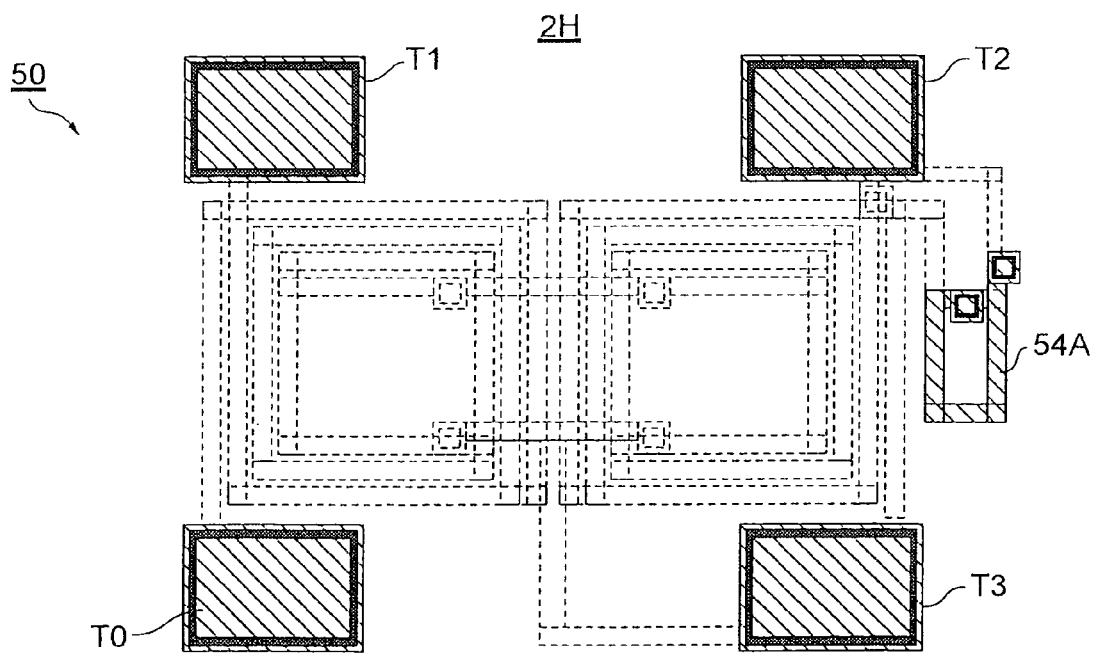
FIG. 43 is a plan view showing the fifth wiring layer 50 of the thin film balun 2H in the example 2H.

In the example 2H, the auxiliary coil portion C5 is positioned so as not to overlap the coil openings and the coil conductors of the second coil portion C2 and the fourth coil portion C4. FIGS. 42 and 43 are plan views respectively showing the fourth wiring layer 40 and the fifth wiring layer 50 of a thin film balun 2H in the example 2H. Note that the first wiring layer 10 to the third wiring layer 30 of the thin film balun 2H in the example 2H have the same structures as the example 1A.

As shown in FIGS. 42 and 43, the auxiliary coil portion C5 is constituted by coil conductors 47A and 48A of the fourth wiring layer 40 and a coil conductor 54A of the fifth wiring layer 50. The coil conductors 47A, 48A, and 54A are respectively obtained by shifting the coil conductors 41, 42, and 51 of the example 2A to an area outside the second coil portion C2. Connection relationships of the coil conductors 47A, 48A, and 54A are the same as the example 2A.

In the example 2H, the auxiliary coil portion C5 is positioned outside so as not to overlap the coil openings and the coil conductors of the second coil portion C2 and the fourth coil portion C4, as shown in FIGS. 42 and 43.

(Evaluation Results 2)

Figure 44:
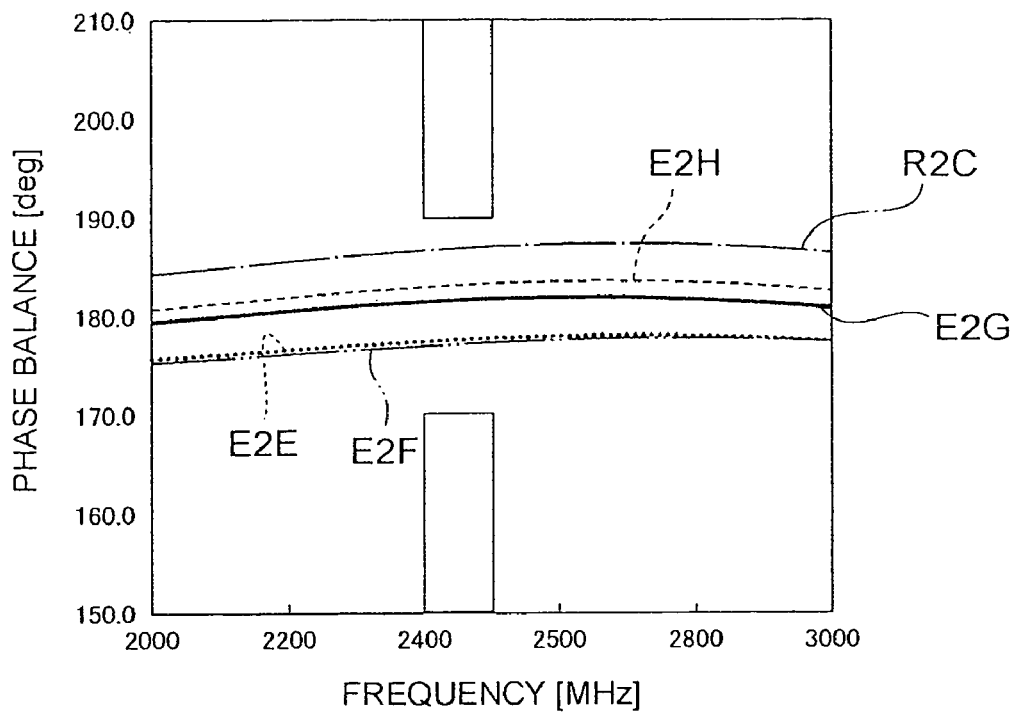
FIG. 44 is a diagram showing phase balance measurement results of the examples 2E to 2H and the comparative example 2C.
Figure 45:
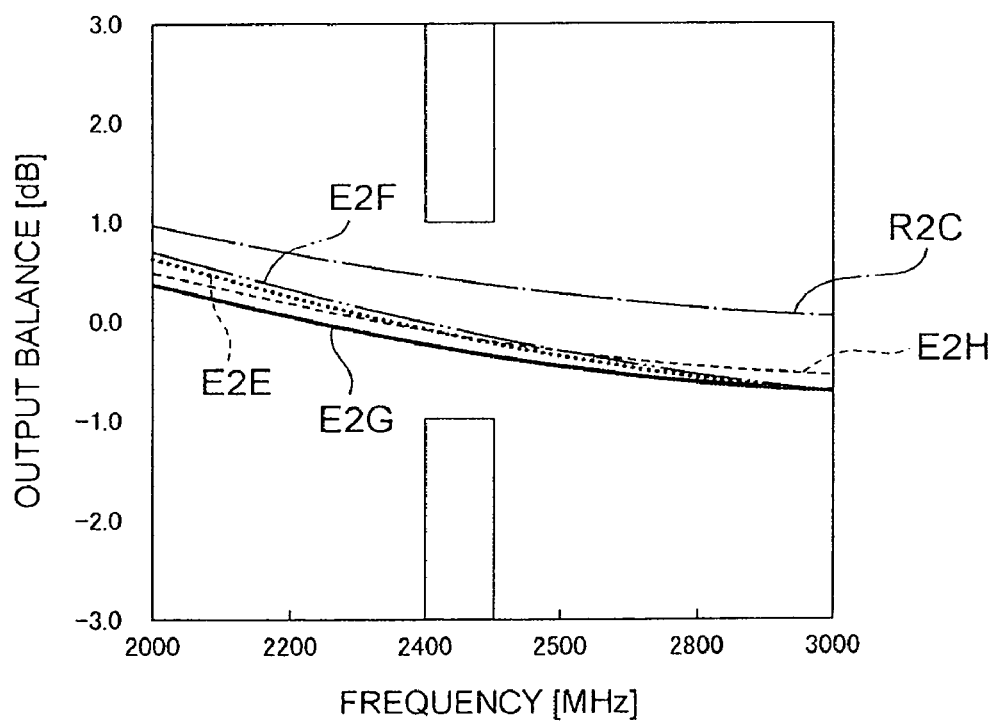
FIG. 45 is a diagram showing output balance measurement results of the examples 2E to 2H and the comparative example 2C.

Balance characteristics of the above-mentioned structures of the examples 2E to 2H and the comparative example 2C were measured by simulation. Target signal frequencies were set at 2400 MHz to 2500 MHz. FIG. 44 is a diagram showing phase balance measurement results, and FIG. 45 is a diagram showing output (amplitude) balance measurement results. In FIGS. 44 and 45, E2E indicates the result of the example 2E, E2F indicates the result of the example 2F, E2G indicates the result of the example 2G, E2H indicates the result of the example 2H, and R2C indicates the result of the comparative example 2C.

As can be understood from FIGS. 44 and 45, the examples 2E to 2H all have an excellent phase balance and output balance. The results shown in FIGS. 44 and 45 indicate that the balance characteristics of the thin film balun are more affected by the inductance of the coil than by the formation position of the coil.

As mentioned earlier, the present invention is not limited to the above embodiment, and various changes can be made without departing from the scope of the present invention. For example, there is no specific limit for the coil shape, so long as a part of the auxiliary coil portion C5 has a bend. Moreover, the auxiliary coil need not be wound one turn or more. For instance, the auxiliary coil may be wound a half turn. In addition, there is no limit for, for example, the arrangement of each of the terminals T0 to T3. Besides, the wiring structure that forms the thin film balun 1 may be less than four layers, or five or more layers. Furthermore, the layer structure may be completely reversed so that the first wiring layer 10 is formed at the uppermost layer and the fifth wiring layer 50 is formed at the lowermost layer.

The above embodiment describes the example where the auxiliary coil portion C5 is wound in the opposite direction to the second coil portion C2, but there is no specific limit for the coil shape so long as a part of the auxiliary coil portion C5 has a winding which is in the opposite direction. Moreover, the auxiliary coil need not be wound one turn or more. For instance, the auxiliary coil may be wound a half turn. In addition, the balance characteristics may be improved by lengthening the coil conductors of the auxiliary coil portion C5 to increase the inductance as opposed to the example 2B, as an example. In this example, there is no limit regarding, for instance, on which wiring layer the auxiliary coil portion C5 is formed. Besides, the auxiliary coil portion C5 may be provided between the third coil portion C3 and the first balanced terminal T1 instead of or in addition to between the fourth coil portion C4 and the second balanced terminal T2. Furthermore, various coil arrangements may be employed without departing from the scope of the present invention.

The thin film balun according to the present invention can realize a thin film balun that has improved balance characteristics while maintaining miniaturization, and therefore can be applied to wireless communication devices which are particularly required to be smaller in size.

The present application is based on Japanese priority applications No. 2008-281409 filed on Oct. 31, 2008 and No. 2008-281772 filed on Oct. 31, 2008, the entire contents of which are hereby incorporated by reference.

What is claimed is:
1. A thin film balun comprising:
an unbalanced transmission line including a first coil portion and a second coil portion;

a balanced transmission line including a third coil portion and a fourth coil portion that are magnetically coupled to the first coil portion and the second coil portion, respectively;

an unbalanced terminal connected to the first coil portion;

a first balanced terminal connected to the third coil portion;

a second balanced terminal connected to the fourth coil portion; and an auxiliary coil portion having a first end portion and a second end portion that is opposite to the first end portion, the first end portion being connected to the fourth coil portion, and the second end portion being connected to the second balanced terminal, wherein the auxiliary coil portion is positioned so as not to overlap coil openings of the first to fourth coil portions.

2. The thin film balun as claimed in claim 1, wherein the auxiliary coil portion is positioned in the area overlapping the coil conductors of the second and fourth coil portions.

3. A thin film balun comprising:

an unbalanced transmission line including a first coil portion and a second coil portion;

a balanced transmission line including a third coil portion and a fourth coil portion that are magnetically coupled to the first coil portion and the second coil portion, respectively;

an unbalanced terminal connected to the first coil portion;

a first balanced terminal connected to the third coil portion;

a second balanced terminal connected to the fourth coil portion; and an auxiliary coil portion having a first end portion and a second end portion that is opposite to the first end portion, the first end portion beir connected to the fourth coil portion, and the second end portion being connected to the second balanced terminal, wherein a winding direction of the auxiliary coil portion is different from a winding direction of at least the second coil portion included in the unbalanced transmission line.

4. The thin film balun as claimed in claim 3, wherein the winding direction of the auxiliary coil portion is opposite to the winding direction of the second coil portion.

5. The thin film balun as claimed in claim 3, wherein at least one part of the auxiliary coil portion is positioned in an area overlapping a coil opening of at least one of the first coil portion and the second coil portion.

6. The thin film balun as claimed in claim 3, wherein the auxiliary coil portion is positioned in the area overlapping the coil conductors of the second and fourth coil portions.

* * * * *